United States Patent
Saitoh et al.

(10) Patent No.: US 12,041,820 B2
(45) Date of Patent: Jul. 16, 2024

(54) METHOD FOR MANUFACTURING ACTIVE MATRIX SUBSTRATE, AND ACTIVE MATRIX SUBSTRATE

(71) Applicant: SHARP KABUSHIKI KAISHA, Sakai (JP)

(72) Inventors: Takao Saitoh, Sakai (JP); Masahiko Miwa, Sakai (JP); Yohsuke Kanzaki, Sakai (JP); Yi Sun, Sakai (JP); Masaki Yamanaka, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 703 days.

(21) Appl. No.: 17/273,287

(22) PCT Filed: Sep. 6, 2018

(86) PCT No.: PCT/JP2018/033058
§ 371 (c)(1),
(2) Date: Mar. 3, 2021

(87) PCT Pub. No.: WO2020/049690
PCT Pub. Date: Mar. 12, 2020

(65) Prior Publication Data
US 2021/0343818 A1    Nov. 4, 2021

(51) Int. Cl.
*H10K 59/121* (2023.01)
*H10K 71/00* (2023.01)
*H10K 59/12* (2023.01)

(52) U.S. Cl.
CPC ......... *H10K 59/1213* (2023.02); *H10K 71/00* (2023.02); *H10K 59/1201* (2023.02)

(58) Field of Classification Search
CPC ............... H10K 71/00; H10K 59/1213; H10K 59/1201; H01L 29/66742
See application file for complete search history.

(56) References Cited

U.S. PATENT DOCUMENTS

2016/0155822 A1*  6/2016  Sang .................... H01L 29/0649
438/99

FOREIGN PATENT DOCUMENTS

JP    H09-305139 A    11/1997

* cited by examiner

*Primary Examiner* — Kyoung Lee
*Assistant Examiner* — Christina A Sylvia
(74) *Attorney, Agent, or Firm* — ScienBiziP, P.C.

(57) ABSTRACT

In a method for manufacturing an active matrix substrate, forming of an underlayer inorganic insulating film includes applying a resist onto the underlayer inorganic insulating film, performing an ashing process of forming a surface having irregularities on a surface of the resist by a first ashing process, and, after the ashing process has been performed, roughening a surface of the underlayer inorganic insulating film by performing a second ashing process and an etching process on the underlayer inorganic insulating film. When forming a semiconductor film, a surface of at least a part of the semiconductor film is roughened following a rough surface of the underlayer inorganic insulating film.

10 Claims, 30 Drawing Sheets

METHOD FOR MANUFACTURING ACTIVE MATRIX SUBSTRATE, AND ACTIVE MATRIX SUBSTRATE

TECHNICAL FIELD

The disclosure relates to a method for manufacturing an active matrix substrate and an active matrix substrate.

BACKGROUND ART

As display elements composing pixels arranged in a matrix pattern, current-drive-type organic electroluminescence (EL) elements are well known. In recent years, development of organic EL display devices including organic EL elements in pixels has been actively performed owing to their advantages of being able to allow an increase in size, a decrease in thickness and vivid image display in a display into which a display device is built.

In particular, such an organic EL display device is frequently formed as an active matrix-type display device that has, at each pixel, a current-drivers display element together with a switch element such as a thin film transistor (TFT) that individually performs control, and controls electro-optical elements on a pixel-by-pixel basis. This is because, if the display device is an active matrix type display device, an image can be displayed with higher resolution than a passive type display device.

A driving TFT for an organic EL display device performs gray scale control in which gray scale is controlled using the magnitude of a flowing current by changing a voltage (for example, see PTL 1).

In this gray scale control, when an S value of I-V characteristics becomes smaller, the slope of the characteristic waveform becomes steeper, which is disadvantageous for gray scale control, and when the S value becomes larger, the slope of the characteristic waveform becomes gentler, which is advantageous for gray scale control. At present, there is a demand for a TFT having a large S value (a gentle slope of the characteristic waveform) of the I-V characteristics, which is advantageous for gray scale control.

CITATION LIST

Patent Literature

PTL 1: JP 09-305139 A

SUMMARY

Technical Problem

Thus, an object of the disclosure is to provide a method for manufacturing an active matrix substrate and an active matrix substrate capable of increasing the S value of I-V characteristics (causing the slope of the characteristic waveform to be gentle), which is advantageous for gray scale control.

Solution to Problem

According to the findings of the inventors of the disclosure, in an active matrix substrate in which an underlayer inorganic insulating film, a semiconductor film, a gate insulating film, and a gate electrode are formed in this order on a substrate, by making a face (surface) of the underlayer inorganic insulating film on a semiconductor film side rough (formed to have irregularities), the semiconductor film formed thereon is roughened as well, and the crystal arrangement of the semiconductor film is disrupted. Consequently, the resistance of the semiconductor film increases, and current cannot easily flow even when the same voltage is applied, in other words, the slope of the waveform of the I-V characteristics becomes gentle.

However, even when an ordinary etching process or an ordinary ashing process is performed on the face (surface) of the underlayer inorganic insulating film on the semiconductor film side, the film is uniformly reduced, and thus it is not possible to make the surface rough (form irregularities) to a degree that disrupts the crystal arrangement of the semiconductor film.

Regarding this point, as a result of diligent study, the inventors of the disclosure have found that, in a case where an active matrix substrate is manufactured, when forming an underlayer inorganic insulating film, by applying a resist onto the underlayer inorganic insulating film, forming a surface having irregularities on the surface of the resist by a first ashing process, and performing a second ashing process and an etching process on the underlayer inorganic insulating film, the surface of the underlayer inorganic insulating film can be roughened. In this way, when forming the semiconductor film, the surface of the semiconductor film can be roughened following the rough surface of the underlayer inorganic insulating film.

The disclosure is based on such knowledge and provides a method for manufacturing an active matrix substrate, and an active matrix substrate described below.

(1) Method for Manufacturing Active Matrix Substrate

A method for manufacturing an active matrix substrate according to the disclosure is a method for manufacturing an active matrix substrate including: forming an underlayer inorganic insulating film on a substrate; forming a semiconductor film on the underlayer inorganic insulating film; patterning the semiconductor film; forming a gate insulating film on the semiconductor film; forming a gate metal film on the gate insulating film; and patterning a gate electrode from the gate metal film, in which the forming of the underlayer inorganic insulating film includes applying a resist onto the underlayer inorganic insulating film, performing an ashing process of forming a surface having irregularities on a surface of the resist by a first ashing process, and, after the ashing process has been performed, roughening a surface of the underlayer inorganic insulating film by performing a second ashing process and an etching process on the underlayer inorganic insulating film, and, in the forming of the semiconductor film, a surface of at least a part of the semiconductor film is roughened following a rough surface of the underlayer inorganic insulating film.

(2) Active Matrix Substrate

An active matrix substrate according to the disclosure is an active matrix substrate in which an underlayer inorganic insulating film, a semiconductor film, a gate insulating film, and a gate electrode are formed in that order on a substrate, in which, the underlayer inorganic insulating film has a roughened area and a flattened area, the roughened area is formed to be a rough surface that is rougher than the flattened area, and a surface of the semiconductor film overlapping the roughened area is roughened following the rough surface of the underlayer inorganic insulating film.

In the method for manufacturing an active matrix substrate according to the disclosure, the underlayer inorganic insulating film has a flattened area, the method further including patterning a roughened area in an area of the flattened area that entirely overlaps the semiconductor film forming transistors as an exemplary aspect. In the active matrix substrate according to the disclosure, the roughened area is formed to entirely overlap the semiconductor film forming transistors as an exemplary aspect.

The method for manufacturing an active matrix substrate according to the disclosure further includes patterning the roughened area that overlaps the semiconductor film that overlaps at least the gate electrode; and patterning and forming a doped area of the semiconductor film such that the flattened area and at least a part of the doped area of the semiconductor film overlap each other as an exemplary aspect. In the active matrix substrate according to the disclosure, an interlayer film and a source electrode are included in order from a side face of the gate electrode that is opposite to the substrate, the roughened area is formed to overlap the semiconductor film that overlaps at least the gate electrode, the semiconductor film is electrically connected to the source electrode via a contact hole formed in the gate insulating film and the interlayer film, and at least the contact hole and the flattened area overlap each other as an exemplary aspect.

In the method for manufacturing an active matrix substrate according to the disclosure, the gate electrode and the roughened area overlap each other, the method further including providing a pixel circuit including a drive transistor in which the gate electrode and the roughened area overlap each other, and having a semiconductor film of which at least a part overlaps the roughened area, and a write transistor in which the flattened area and the gate electrode overlap each other via the semiconductor film The active matrix substrate according to the disclosure includes a pixel circuit including a drive transistor and a write transistor, the gate electrode and the roughened area overlap each other in the semiconductor film forming the drive transistor in the pixel circuit, and the gate electrode and the flattened area overlap each other in the semiconductor film forming the write transistor as an exemplary aspect.

The method for manufacturing an active matrix substrate according to the disclosure further includes providing the semiconductor film, which is a continuous semiconductor film forming a write transistor and a light emission control transistor, and at least a part of which overlaps the flattened area between the light emission control transistor and the write transistor as an exemplary aspect. In the active matrix substrate according to the disclosure, the write transistor and the light emission control transistor are formed of the semiconductor film, which is continuous, and at least a part of the semiconductor film between the light emission control transistor and the write transistor overlaps the flattened area as an exemplary aspect.

he method for manufacturing an active matrix substrate according to the disclosure further includes providing the light emission control transistor having the semiconductor film in which the gate electrode and the flattened area overlap each other as an exemplary aspect. In the active matrix substrate according to the disclosure, the gate electrode and the flattened area overlap each other in the semiconductor film forming the light emission control transistor as an exemplary aspect.

The method for manufacturing an active matrix substrate according to the disclosure further includes providing an initialization transistor for a drive transistor having the semiconductor film in which the gate electrode and the roughened area overlap each other as an exemplary aspect. In the active matrix substrate according to the disclosure, the gate electrode and the roughened area overlap each other in the semiconductor film forming an initialization transistor for a drive transistor as an exemplary aspect.

The method for manufacturing an active matrix substrate according to the disclosure further includes providing an initialization transistor for a drive transistor having the semiconductor film that entirely overlaps the roughened area as an exemplary aspect. In the active matrix substrate according to the disclosure, the semiconductor film entirely overlaps the roughened area in the semiconductor film forming the initialization transistor for a drive transistor as an exemplary aspect.

The method for manufacturing an active matrix substrate according to the disclosure further includes providing a threshold voltage compensation transistor having the semiconductor film in which the gate electrode and the roughened area overlap each other as an exemplary aspect. In the active matrix substrate according to the disclosure, the gate electrode and the roughened area overlap each other in the semiconductor film forming the threshold voltage compensation transistor as an exemplary aspect.

The method for manufacturing an active matrix substrate according to the disclosure further includes providing a threshold voltage compensation transistor having the semiconductor film that entirely overlaps the roughened area as an exemplary aspect. In the active matrix substrate according to the disclosure, the semiconductor film entirely overlaps the roughened area in the semiconductor film forming the threshold voltage compensation transistor as an exemplary aspect.

Advantageous Effects of Disclosure

According to the disclosure, the S value of I-V characteristics can be increased (the slope of a characteristic waveform can be made gentle), which is advantageous for gray scale control.

DESCRIPTION OF EMBODIMENTS

Figure 1:
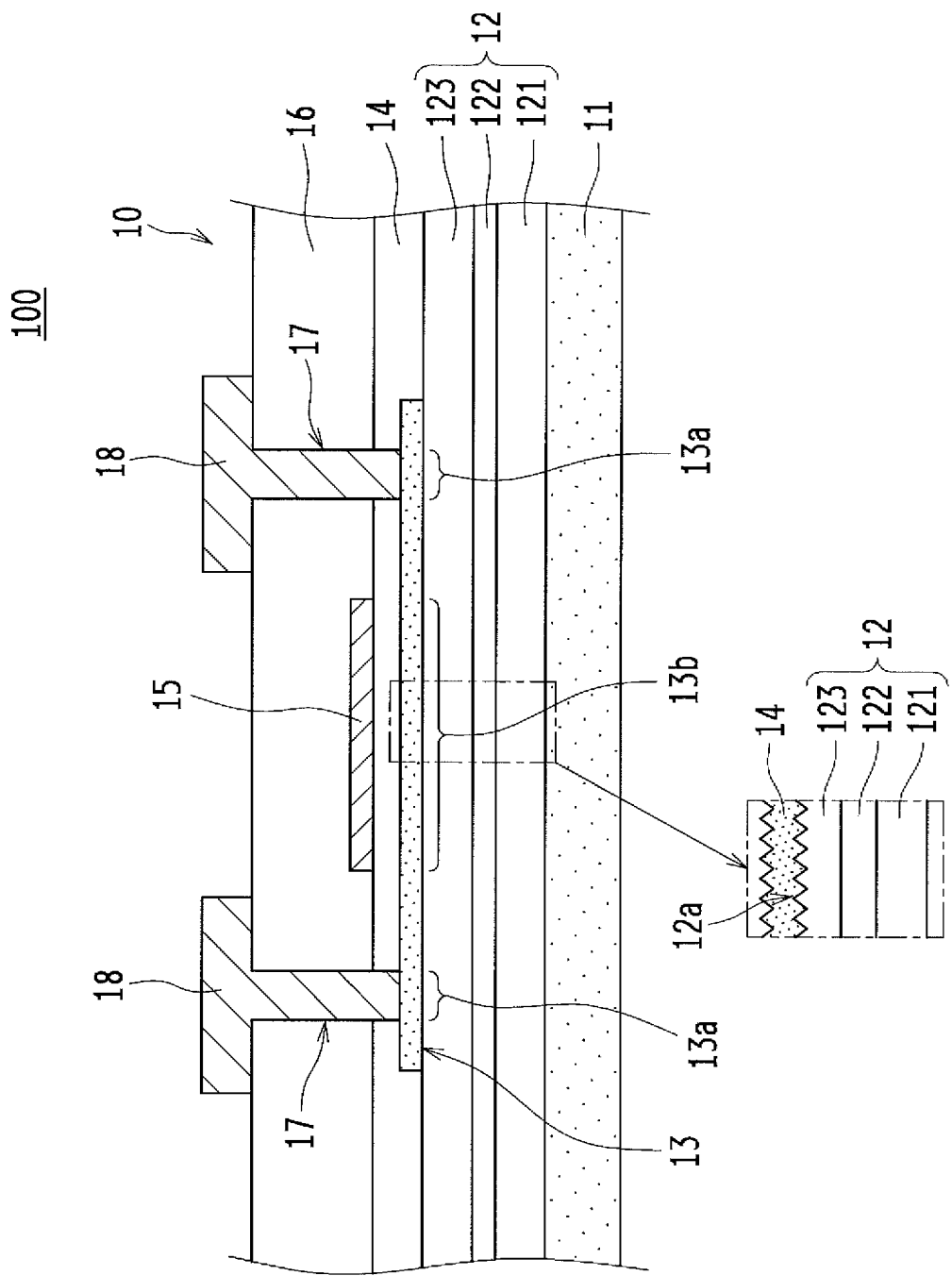
FIG. 1 is a schematic cross-sectional view illustrating an example of the structure of a part of an active matrix substrate in an organic EL display device according to an embodiment.

Embodiments according to the disclosure will be described below in detail with reference to the drawings. Note that in the present specification and the drawings, constituent elements having substantially the same functional configurations will be given the same reference numerals, and redundant descriptions thereof will be omitted.

Configuration of Active Matrix Substrate

FIG. 1 is a schematic cross-sectional view illustrating an example of the structure of a part of an active matrix substrate 10 in an organic EL display device 100 according to this embodiment.

The active matrix substrate 10 includes a substrate 11, an underlayer inorganic insulating film 12 (a base coat film), a semiconductor film 13 (an oxide semiconductor film), a gate insulating film 14, a gate electrode 15, an interlayer film 16 (an interlayer insulating film), source electrodes 18 and 18, and a drain electrode (not illustrated). The semiconductor film 13 includes source regions 13a and 13a, a drain region (not illustrated), and a channel region 13b. In addition, contact holes 17 and 17 are formed in the interlayer film 16, and the source electrodes 18 and 18 are connected to the source regions 13a and 13a of the semiconductor film 13 via the contact holes 17 and 17.

The substrate 11 is a flat plate-shaped member that holds parts of the active matrix substrate 10 and is, for example, formed using glass, a polyimide resin, or the like.

The underlayer inorganic insulating film 12 is a film that is formed of an insulating material and that is formed on the substrate 11. In this example, the underlayer inorganic insulating film 12 includes an underlayer inorganic insulating film lower layer 121, an underlayer inorganic insulating film intermediate layer 122, and an underlayer inorganic insulating film upper layer 123. The underlayer inorganic insulating film lower layer 121 is composed of $SiO_2$, the underlayer inorganic insulating film intermediate layer 122 is composed of $SiN_x$, and the underlayer inorganic insulating film upper layer 123 is composed of $SiO_2$.

The semiconductor film 13 is formed on the underlayer inorganic insulating film 12 and is formed using an oxide-based semiconductor material. The source regions 13a and 13a are regions of the semiconductor film 13 that overlap the source electrodes 18 and 18, The drain region (not illustrated) is a region of the semiconductor film 13 that overlaps the drain electrode (not illustrated). The channel region 13b is a region of the semiconductor film 13 that overlaps the gate electrode 15. A specific example of the semiconductor film 13 will be described below.

The gate insulating film 14 is a film that is formed of an insulating material and that is formed on the semiconductor film 13, and, for example, a single-layer film or a layered film using a material such as $SiO_2$, $SiN_x$, $SiO_xN_y$ (here, x>y), $SiN_xO_y$ (here, x>y), or the like can be used.

The gate electrode 15 is a film composed of a conductive material that is formed on the underlayer inorganic insulating film 12 and the gate insulating film 14 and is formed of a gate metal film. Specific examples of the gate metal film include, for example, a metal film containing an element selected from materials such as Al, W, Mo, Ta, Cr, Cu, and Ti, or alloy films containing these elements as components.

The interlayer film 16 is a film composed of an insulating material provided on the gate insulating film 14 and the gate electrode 15, and, for example, a single-layer film or a layered film using any of materials such as $SiO_2$, $SiN_x$, $SiO_xN_y$ (x>y), $SiN_xO_y$ (x>y), and the like can be used. When the interlayer film 16 is formed to have a multi-layer structure, a known capacitance wiring line and the like can be formed between a first layer and a second layer.

The contact holes 17 and 17 are holes that are formed in the interlayer film 16 and the gate insulating film 14 to reach the semiconductor film 13 from the surface of the interlayer film 16 and are filled with the source electrodes 18 and 18.

The source electrodes 18 and 18 are films composed of conductive materials that are formed in areas covering the contact holes 17 and 17 on the interlayer film 16, The drain electrode (not illustrated) is a film composed of a conductive material that is formed in an area covering the contact holes (not illustrated) on the interlayer film 16. The source electrodes 18 and 18 and the drain electrode (not illustrated) are formed of a source metal film and a drain metal film. Specific examples of the source metal film and the drain metal film include a single-layer film, a layered film, and an alloy film, for example, using materials such as Ti, Al, Mo, Ta, W, and Cu. Examples of the layered film include Ti/Al/Ti, Ti/Al/Mo, and the like, An oxide semiconductor material included in the semiconductor film 13 may be an amorphous oxide semiconductor or may be a crystalline oxide semiconductor including a crystalline portion. Examples of the crystalline oxide semiconductor include a polycrystalline oxide semiconductor, a microcrystalline oxide semiconductor, and a crystalline oxide semiconductor having a c axis oriented substantially perpendicular to the layer surface.

The semiconductor film 13 may have a layered structure including two or more layers. In a case where the semiconductor film 13 has the layered structure, the semiconductor film 13 may include an amorphous oxide semiconductor film and a crystalline oxide semiconductor film. Alternatively, the semiconductor film 13 may include a plurality of crystalline oxide semiconductor films having different crystal structures. The semiconductor film 13 may include a plurality of amorphous oxide semiconductor films.

Materials, structures, and film formation methods of the amorphous oxide semiconductor and the crystalline oxide semiconductors described above, a structure of the oxide semiconductor film having the layered structure, and the like are, for example, described in JP 2014-007399 A. The entire contents of the disclosure of JP 2014-007399 A are incorporated herein by reference.

For example, the semiconductor film 13 may include at least one metal element selected from In, Ga, and Zn. In this embodiment, for example, the semiconductor film 13 includes an In—Ga—Zn—O-based semiconductor (for example, indium gallium zinc oxide). Here, the In—Ga—Zn—O-based semiconductor is a ternary oxide of indium (In), gallium (Ga), and zinc (Zn), and a ratio (a composition ratio) of In, Ga, and Zn is not particularly limited to a specific value, and examples include ratios of In:Ga:Zn=2:2:1, In:Ga:Zn=1:1:1, In:Ga:Zn=1:1:2, and the like. Such a semiconductor film 13 can be formed from an oxide semiconductor film including an In—Ga—In—O based semiconductor.

The In—Ga—Zn—O-based semiconductor may be an amorphous semiconductor or may be a crystalline semiconductor. A crystalline in-Ga—Zn—O-based semiconductor in which a c axis is oriented substantially perpendicular to a layer surface is preferable as the crystalline In—Ga—Zn—O based semiconductor.

Note that a crystal structure of the crystalline In—Ga—Zn—O-based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein by reference. A TFT including an In—Ga—Zn—O-based semiconductor film has high mobility (more than 20 times that of an a-Si TFT) and a low leakage current (less than 1/100 of that of an a-Si TFT). Thus, such a TFT can be suitably used as a drive TFT (for example, a TFT included in a drive circuit provided on the periphery of a display region including a plurality of pixels on the same substrate as the display region) and a pixel TFT (a TFT provided in a pixel).

The oxide semiconductor film may include another oxide semiconductor in place of the In—Ga—Zn—O-based semiconductor. For example, the oxide semiconductor film may contain an In—Sn—Zn—O-based semiconductor (more specifically, $In_2O_3$—$SnO_2$—$ZnO$; InSnZnO). The In—Sn—Zn—O-based semiconductor is a ternary oxide of indium (In), tin (Sn), and zinc (Zn). Alternatively, the oxide semiconductor film may include an In—Al—Zn—O-based semiconductor, an In—Al—Sn—Zn—O-based semiconductor, a Zn—O-based semiconductor, an In—Zn—O based semiconductor, a Zn—Ti—O-based semiconductor, a Cd—Ge—O-based semiconductor, a Cd—Pb—O-based semiconductor, cadmium oxide (CdO), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, $InGaO_3(ZnO)_5$, magnesium zinc oxide ($Mg_xZn_{1-x}O$), cadmium zinc oxide ($Cd_xZn_{1-x}NO$), and the like.

Manufacturing Method of Active Matrix Substrate

A method for manufacturing the active matrix substrate 10 according to this embodiment includes steps of: forming the underlayer inorganic insulating film 12 on the substrate 11 (PI substrate) using a plasma CVD method; forming the semiconductor film 13 on the underlayer inorganic insulating film 12; patterning the semiconductor film 13 (a semiconductor film patterning step); forming the gate insulating film 14 over the semiconductor film 13 (a gate insulating film forming step); forming a gate metal film over the gate insulating film 14 (a gate metal film forming step); and patterning the gate electrode 15 from the gate metal film (a gate electrode patterning step).

For example, the underlayer inorganic insulating film 12 is formed of a single-layer film or a layered film of silicon nitride [$SiO_xN_y$, (x>y)], silicon oxide ($SiO_x$), silicon oxynitride [$SiN_xO_y$, (x>y)], or the like. The underlayer inorganic insulating film 12 is not particularly limited, and, for example, a layered film having a silicon nitride ($SiN_x$) film as a lower layer and a silicon oxide ($SiO_x$) film as an upper layer may be formed as the underlayer inorganic insulating film 12.

In the organic EL display device 100, at present, there is a demand for production of a TFT having a large S value of the I-V characteristics (the slope of the characteristic waveform is gentle), which is advantageous for gray scale control.

Figure 2A:
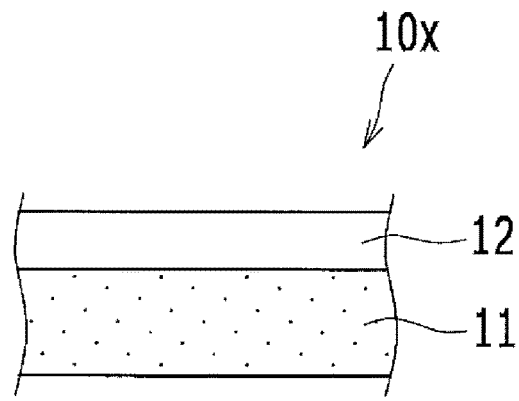
FIG. 2A is a process drawing of a method for manufacturing an active matrix substrate of a reference example.
Figure 2B:
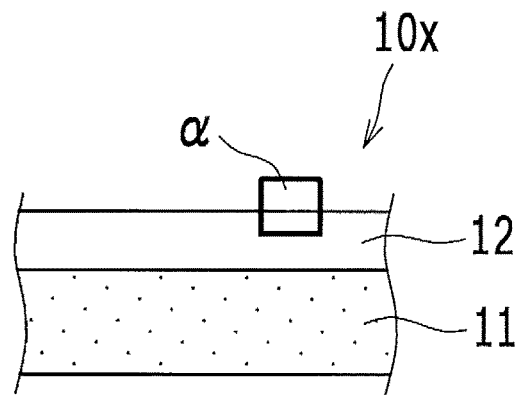
FIG. 2B is a process drawing of the method for manufacturing an active matrix substrate of the reference example.
Figure 2C:
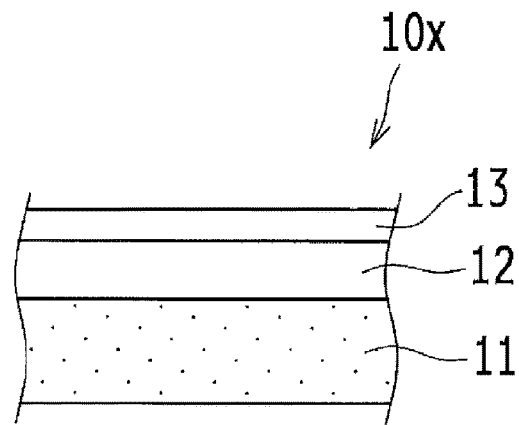
FIG. 2C is a process drawing of the method for manufacturing an active matrix substrate of the reference example.
Figure 3A:
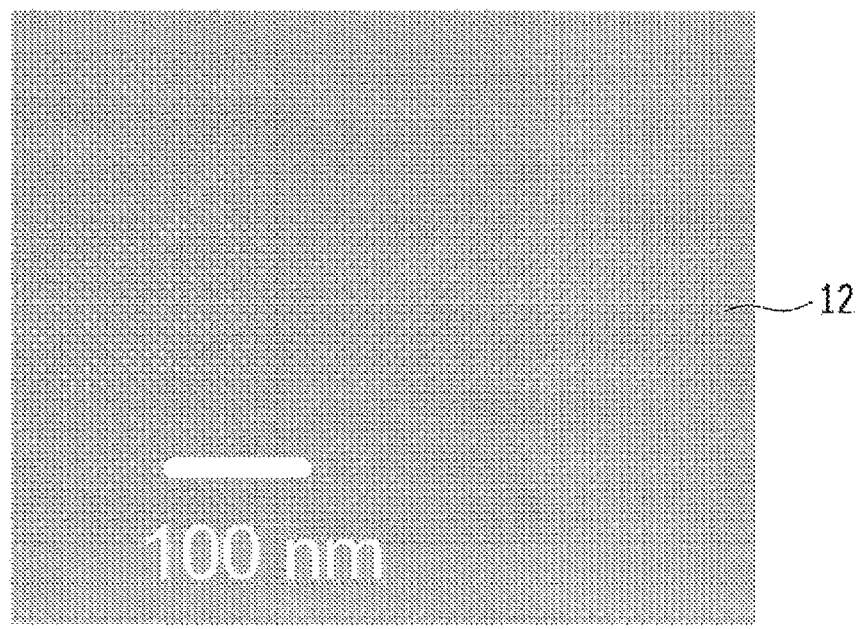
FIG. 3A is an enlarged plan photograph of a part α, which is illustrated in FIG. 2B, of an underlayer inorganic insulating film formed on a substrate.
Figure 3B:
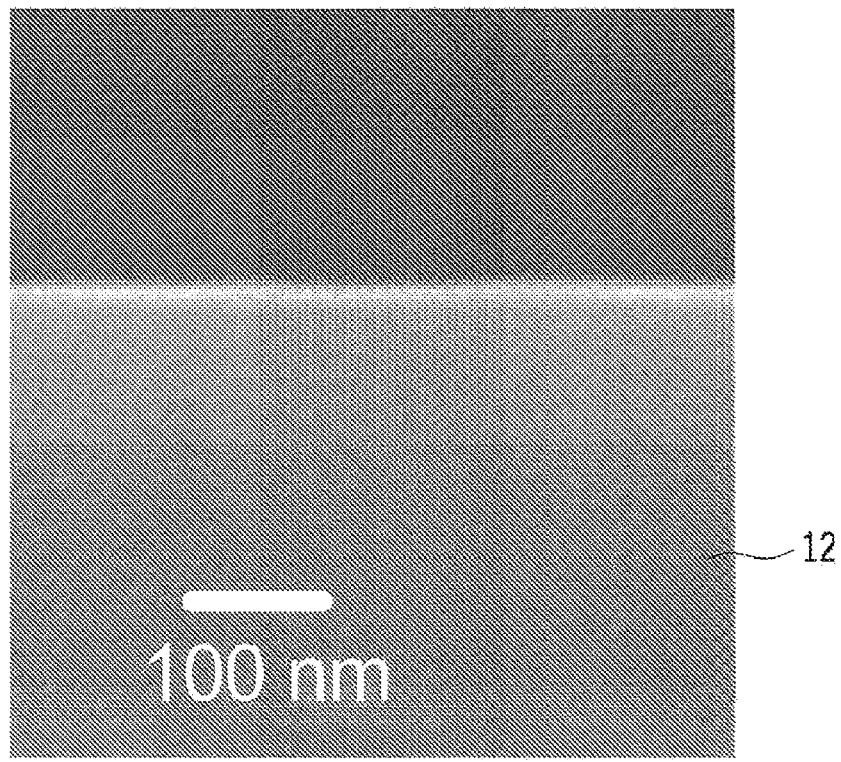
FIG. 3B is an enlarged cross-sectional photograph of a part α, which is illustrated in FIG. 2B, of the underlayer inorganic insulating film formed on the substrate.

FIGS. 2A to 2C are process drawings of a method for manufacturing an active matrix substrate 10X of a reference example. FIGS. 3A and 3B are an enlarged plan photograph and an enlarged cross-sectional photograph of a part α, which is illustrated in FIG. 2B, of the underlayer inorganic insulating film 12 formed on a substrate 11.

In the method for manufacturing the active matrix substrate lox, first, as illustrated in FIG. 2A, an underlayer inorganic insulating film 12 is formed on the substrate 11. Next, as illustrated in FIG. 2B, an etching process or an ashing process is performed on the underlayer inorganic insulating film 12. In this way, even when an ordinary etching process or an ordinary ashing process is performed on the underlayer inorganic insulating film 12, as illustrated in FIGS. 3A and 3B, the film is uniformly reduced. Thus, as illustrated in FIG. 2C, even when the semiconductor film 13 is formed on the underlayer inorganic insulating film 12, the semiconductor film 13 cannot be formed into a rough surface (form irregularities) to a degree that disrupts the crystal arrangement of the semiconductor film 13.

First Embodiment

Figure 5A:
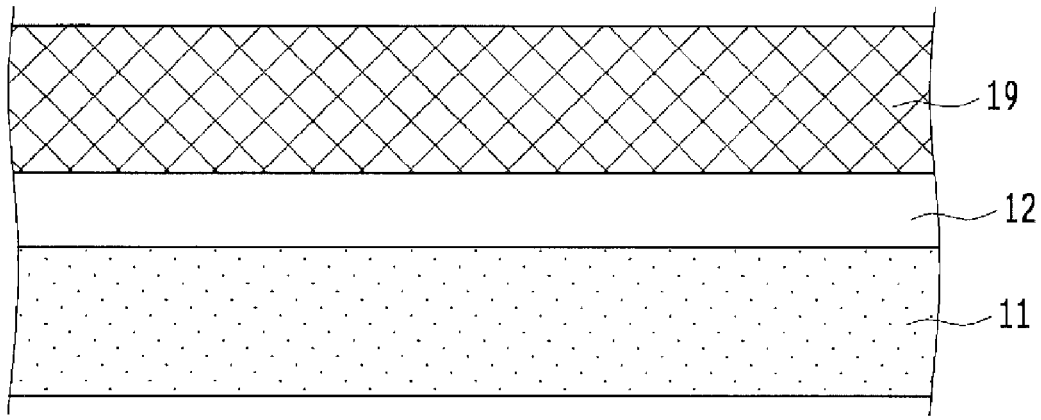
FIG. 5A is a process drawing illustrating manufacturing of the active matrix substrate according to the first embodiment.
Figure 5B:
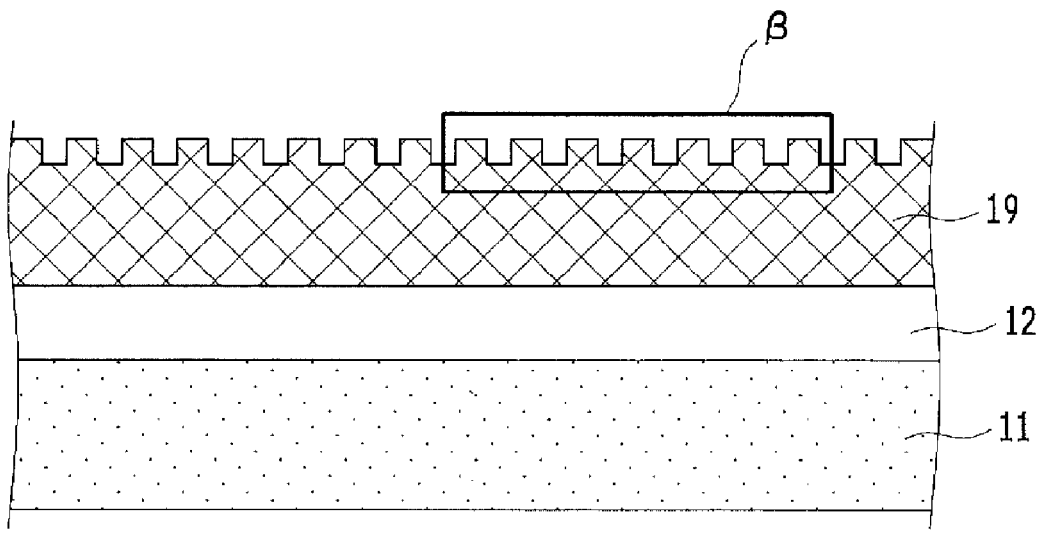
FIG. 5B is a process drawing illustrating manufacturing of the active matrix substrate according to the first embodiment.
Figure 5C:
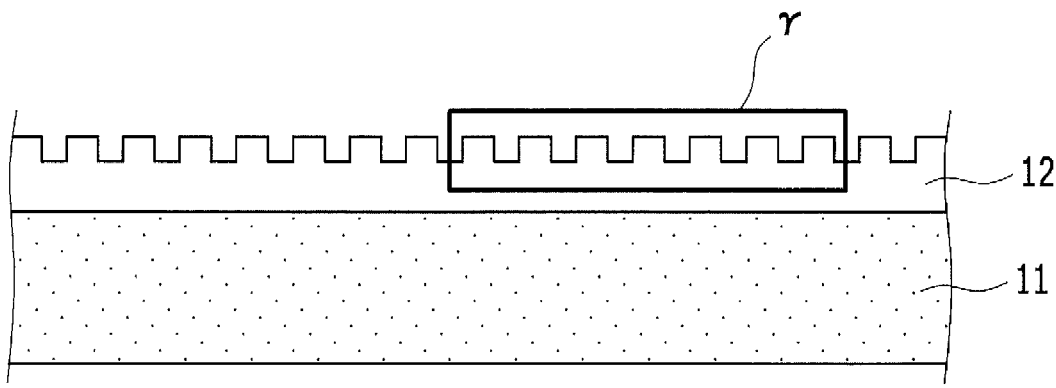
FIG. 5C is a process drawing illustrating manufacturing of the active matrix substrate according to the first embodiment.

In this respect, in an active matrix substrate 10 according to a first embodiment, a step of forming an underlayer inorganic insulating film 12 includes a step of applying a resist 19 (a resist film) onto the underlayer inorganic insulating film 12 (a resist applying step) (see FIG. 5A and the like to be described below); an ashing process step of forming a surface having irregularities on the surface of the resist 19 by performing a first ashing process (see FIG. 5B and the like); and a surface roughening step of roughening (forming irregularities on) the surface of the underlayer inorganic insulating film 12 by performing a second ashing process and an etching process for the underlayer inorganic insulating film 12 after the ashing process step (see FIG. 5C and the like). Then, in a semiconductor film forming step of forming a semiconductor film 13 (see FIG. 5E and the like), a surface of at least a part (all or a part) of the semiconductor film 13 is roughened (formed to have irregularities) following the rough surface (the surface having irregularities) of the underlayer inorganic insulating film 12.

According to the first embodiment, when an underlayer inorganic insulating film 12 is formed, a resist 19 is applied to the underlayer inorganic insulating film 12, a rough surface (a surface having irregularities) is formed on the surface of the resist 19 by performing the first ashing process, and the second ashing process and an etching process of the underlayer inorganic insulating film 12 are performed. By doing this, the surface of the underlayer inorganic insulating film 12 can be roughened (formed to have irregularities). In this way, when the semiconductor film 13 is formed, the surface of the semiconductor film 13 can be roughened (formed to have irregularities) following the rough surface (the surface having irregularities) of the underlayer inorganic insulating film 12, and the crystal arrangement of the semiconductor film 13 can be disrupted. Then, the resistance of the semiconductor film 13 increases, and current cannot easily flow even when the same voltage is applied, in other words, the slope of the waveform of the I-V characteristics becomes gentle. Thus, the S value of the characteristics can be increased (the slope of the characteristic waveform can be made gentle), which is advantageous for gray scale control.

More specifically, the active matrix substrate 10 according to the first embodiment can be manufactured as follows.

Figure 4A:
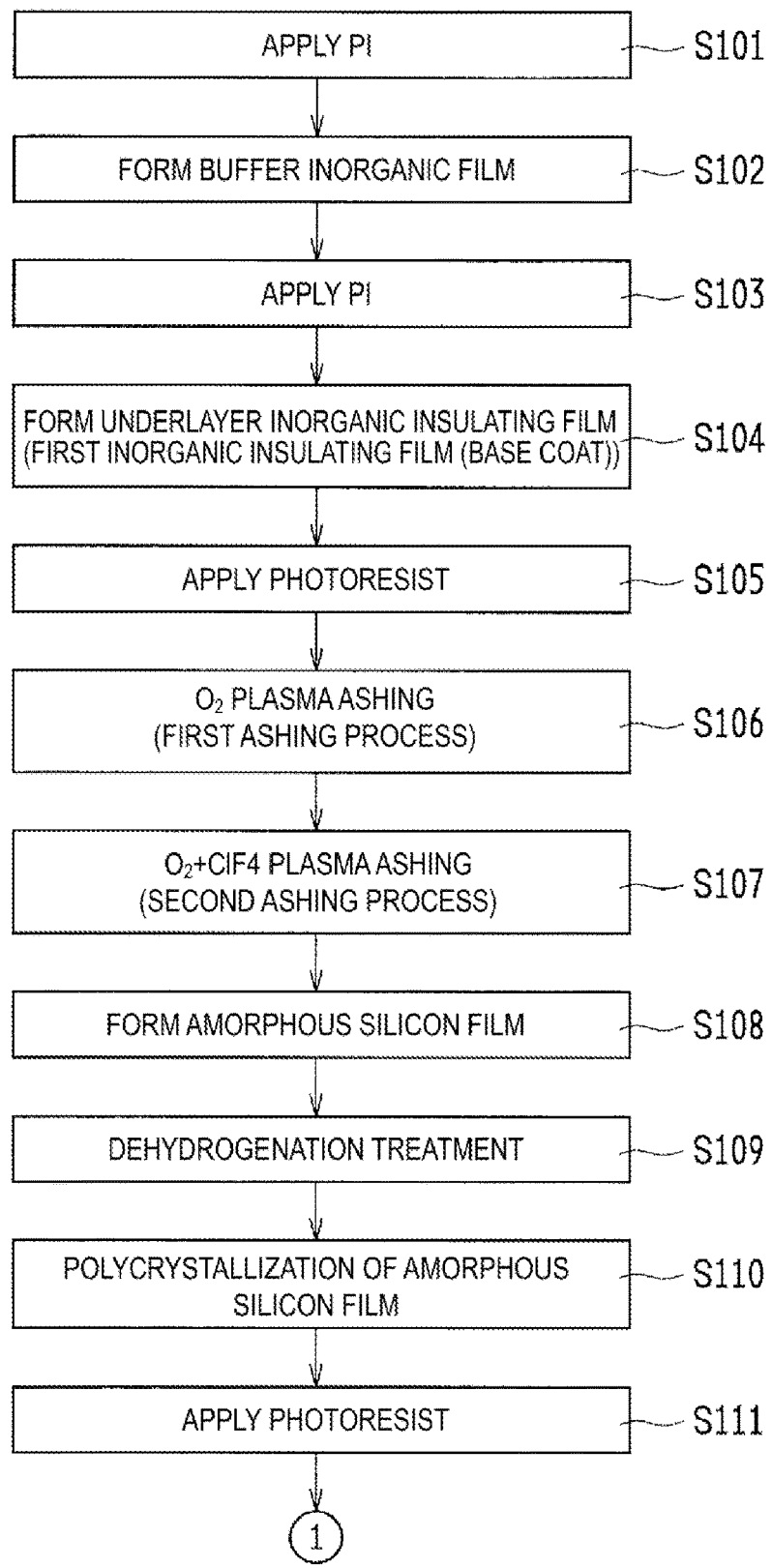
FIG. 4A is a flowchart for manufacturing an active matrix substrate according to a first embodiment.
Figure 4B:
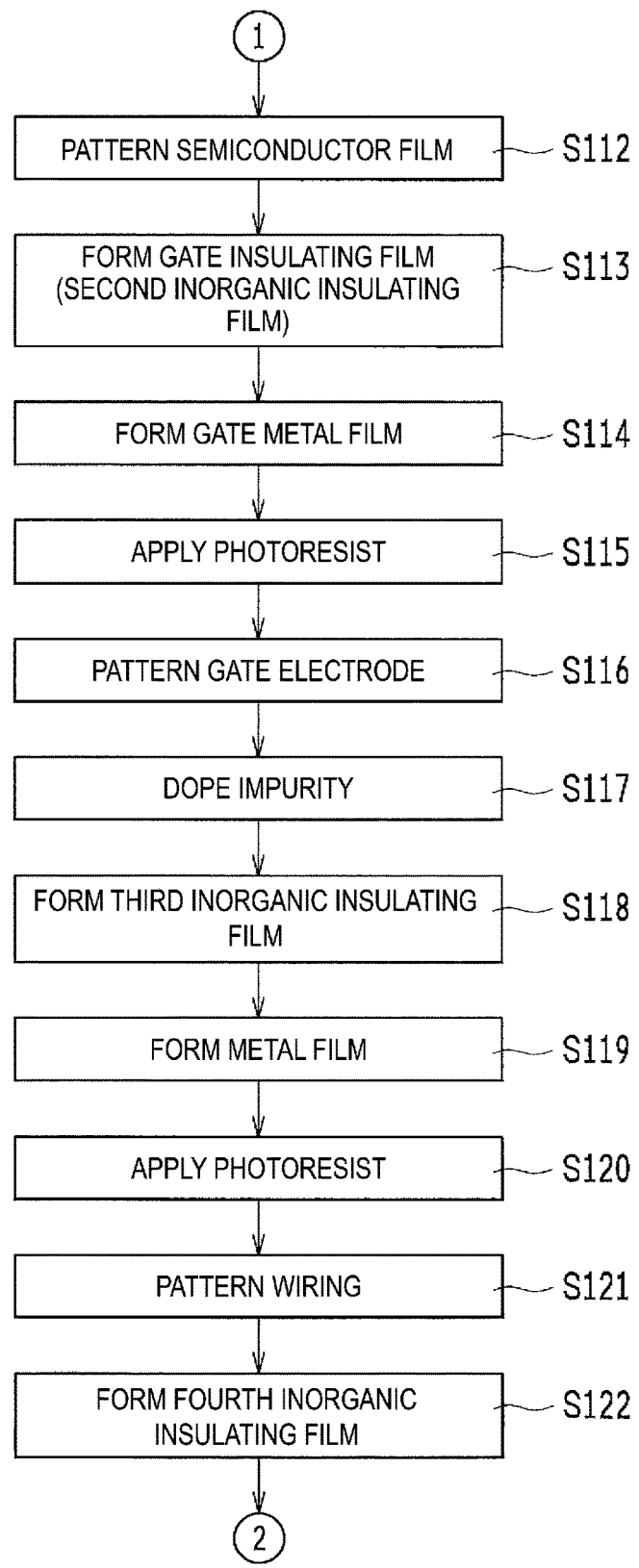
FIG. 4B is a flowchart for manufacturing the active matrix substrate according to the first embodiment.
Figure 4C:
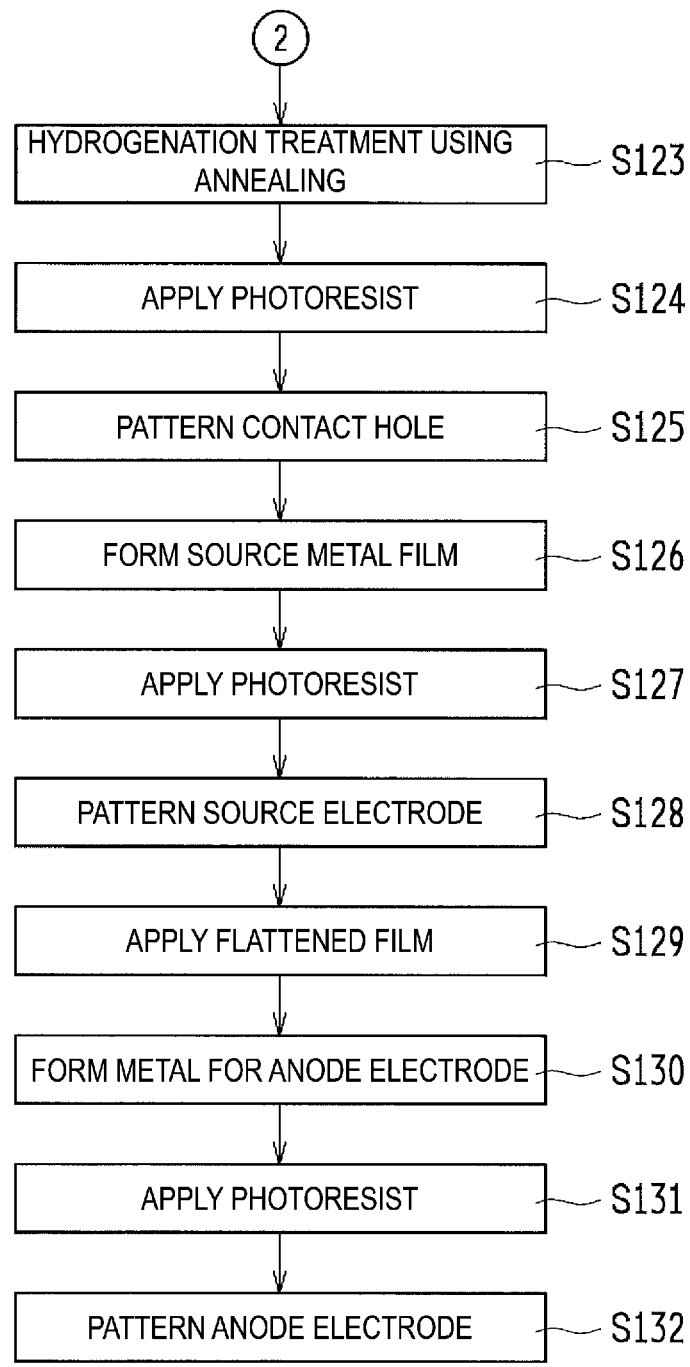
FIG. 4C is a flowchart for manufacturing the active matrix substrate according to the first embodiment.
Figure 7A:
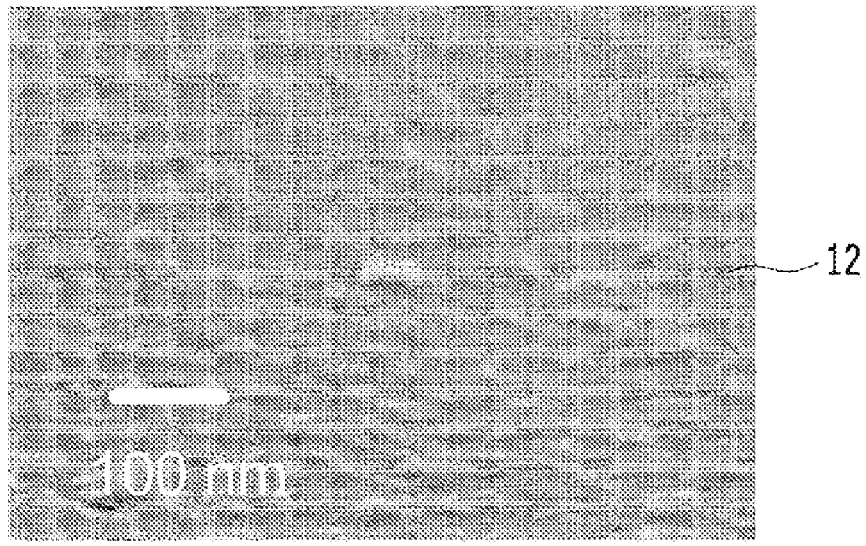
FIG. 7A is an enlarged plan photograph of a part γ, which is illustrated in FIG. 5C, of an underlayer inorganic insulating film on which a second ashing process and a resist treatment have been performed.
Figure 7B:
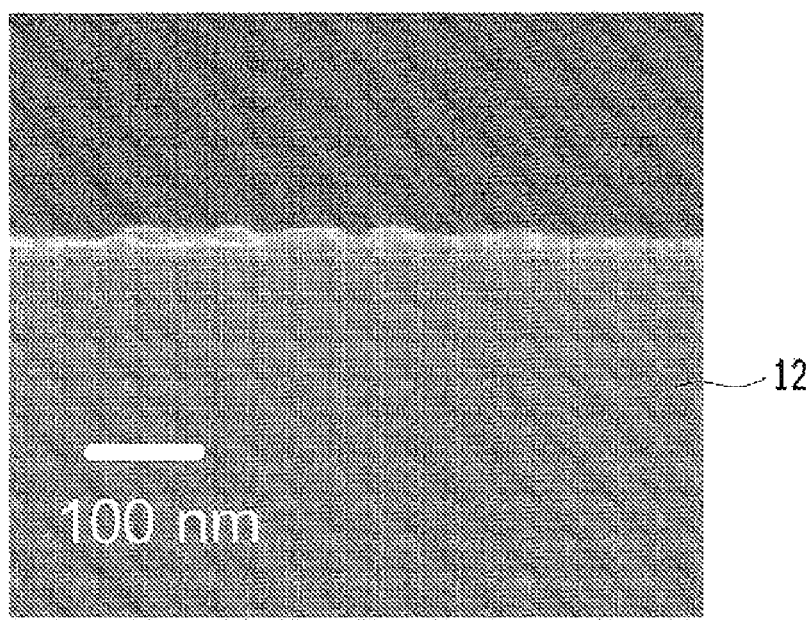
FIG. 7B is an enlarged plan photograph of the part γ, which is illustrated in FIG. 5C, of the underlayer inorganic insulating film on which the second ashing process and the resist treatment have been performed.
Figure 8:
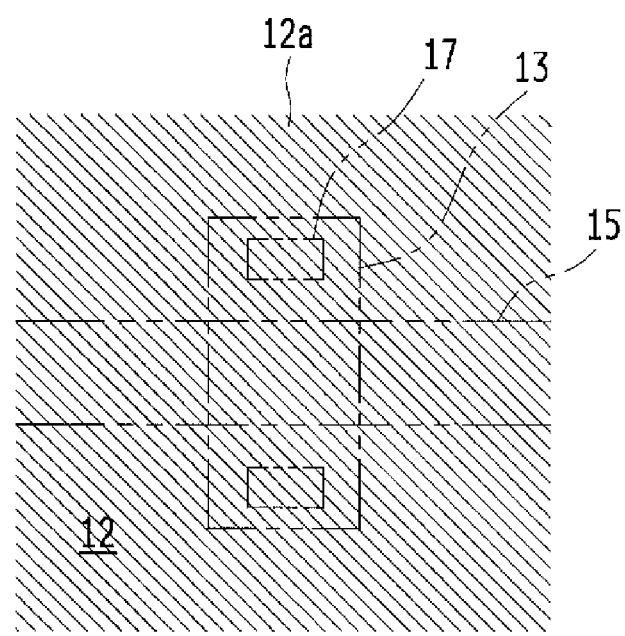
FIG. 8 is a plan view illustrating an underlayer inorganic insulating film roughened in the process illustrated in FIG. 5C together with a semiconductor film, a gate electrode, and a contact hole.

FIGS. 4A to 4C are flowcharts illustrating steps of manufacturing the active matrix substrate 10 according to the first embodiment. FIGS. 5A to 5H are process drawings illustrating steps of manufacturing of the active matrix substrate 10 according to the first embodiment. FIGS. 6A and 6h are an enlarged plan photograph and an enlarged cross-sectional photograph of a part β, which is illustrated in FIG. 5B, of the resist 19 on which the first ashing process has been performed. FIGS. 7A and 7B are an enlarged plane photograph and an enlarged plane photograph of a part γ, which is illustrated in FIG. 5C, of the underlayer inorganic insulating film 12 for which a second ashing process and a resist treatment have been performed. FIG. 8 is a plan view illustrating the underlayer inorganic insulating film 12 roughened in the process illustrated in FIG. 5C together with the semiconductor film 13, a gate electrode 15, and a contact hole 17. In FIG. 8, diagonal lines represent a roughened area 12a.

Underlayer Inorganic Insulating Film Forming Step

After a polyimide (PI) film is applied onto a substrate such as glass (S101 in FIG. 4A) and the polyimide (PI) film is cured, a buffer inorganic film is formed (S102), and the polyimide (PI) film is applied (S103) and cured again, whereby a substrate 11 having flexibility is acquired by being peeled off a base material. In a case where the substrate 11 does not require flexibility, glass having a flat plate shape can be also used as the substrate 11. Thereafter, the underlayer inorganic insulating film 12 (a first inorganic insulating film) is formed on the substrate 11 (S104).

Resist Applying Step

As illustrated in FIG. 5A, a resist 19 (photoresist) is applied onto the underlayer inorganic insulating film 12 using a slit coater (S105). The thickness of the resist 19 may be, for example, 1 μm to 2 μm.

Ashing Process Step

Figure 6A:
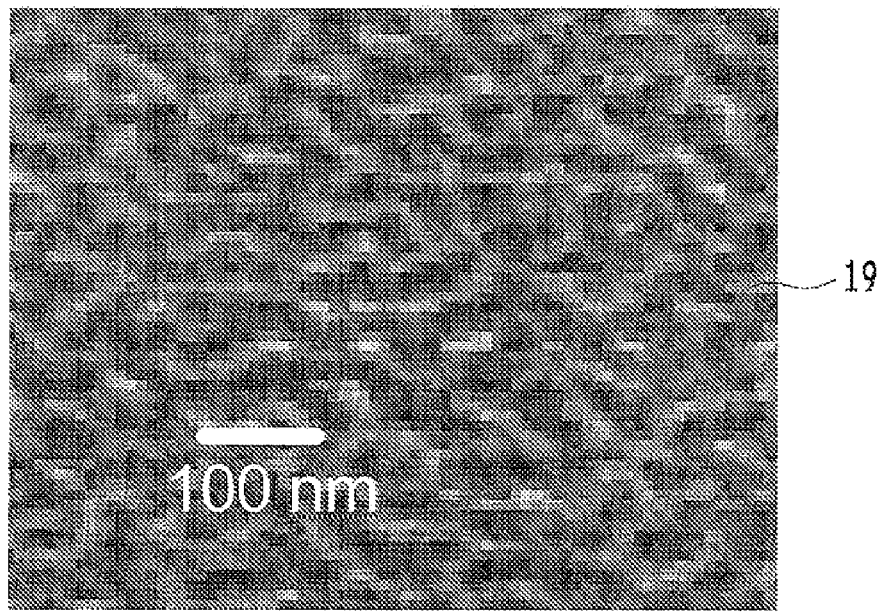
FIG. 6A is an enlarged plan photograph of a part β, which is illustrated in FIG. 5B, of a resist on which a first ashing process has been performed.
Figure 6B:
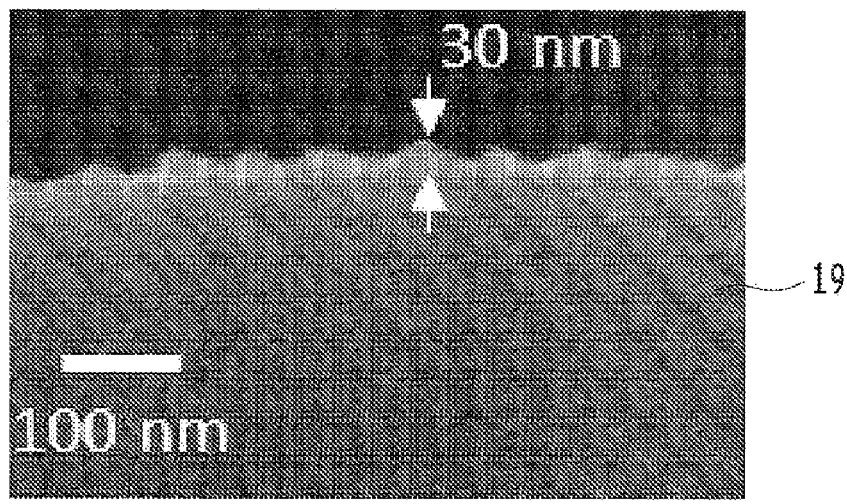
FIG. 6B is an enlarged plan photograph of the part β, which is illustrated in FIG. 5B, of the resist on which the first ashing process has been performed.

As illustrated in FIG. 5B, FIG. 6A, and FIG. 6B, a first gas plasma ($O_2$ plasma) ashing process (a first ashing process) is performed on the resist 19 (S106). In a case where the substrate size is, for example, 730 mm×920 mm, the pressure inside a chamber in a plasma apparatus may be set, for example, to 500 mT to 3000 mT, the power of a high-frequency power source used for generating inductively coupled plasma may be set, for example, to 1000 kW to 5000 kW, and the flow rate of the oxygen gas may be set, for example, to 1000 sccm to 5000 sccm. For example, the processing time may be set to 20 sec to 180 sec.

Roughening Step

Furthermore, as illustrated in FIG. 5C, FIG. 7A, and FIG. 7B, a second gas plasma (mixed gas plasma of $O_2$ and $CF_4$) ashing process (a second ashing process) and plasma etching are performed (S107) on the underlayer inorganic insulating film 12. By doing so, irregular shapes are formed on the surface of the underlayer inorganic insulating film 12. The pressure inside the chamber in the plasma apparatus may be set, for example, to 10 mT to 3000 mT, the power of the high-frequency power source used for generating inductively-coupled plasma may be set, for example, to 1000 kW to 15000 kW, the flow rate of the oxygen gas may be set, for example, to 1000 sccm to 5000 sccm, and the flow rate of $CF_4$ gas may be set, for example, to 100 sccm to 5000 sccm. The processing time may be set, for example, to 60 sec to 300 sec. Here, in the second ashing process, although resist peeling is also performed, in order to remove a resist residue, a wet resist peeling process may be provided after the second ashing process. Furthermore, after the second ashing process, resist peeling may be performed.

Semiconductor Film Forming Step

Figure 5D:
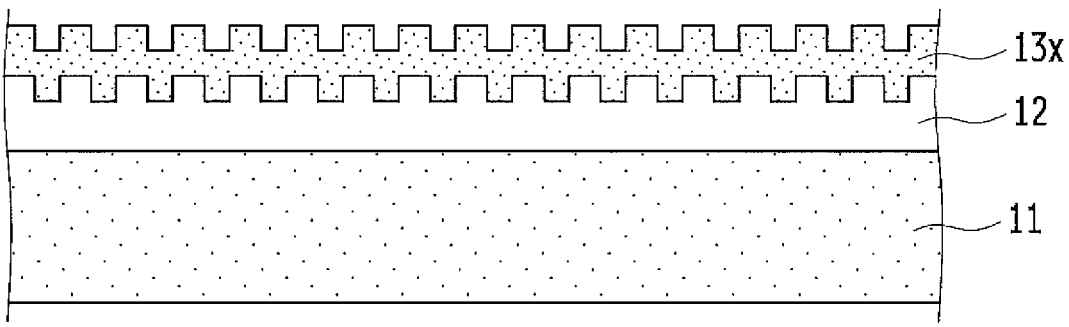
FIG. 5D is a process drawing illustrating manufacturing of the active matrix substrate according to the first embodiment.

First, as illustrated in FIG. 5D, an amorphous silicon (a-Si) film 13x is formed on the underlayer inorganic insulating film 12 by using a plasma CVD method (S108). At this time, the irregular shape of the surface of the underlayer inorganic insulating film 12 is reflected in the surface of the amorphous silicon film 13x as well. Here, hydrogen is included in the amorphous silicon film 13x formed using the plasma CND method, and thus a process of reducing hydrogen concentration in the amorphous silicon film 13x (a dehydrogenation treatment) is performed by heating the amorphous silicon film 13x at a heating temperature of approximately 400° C. (S109).

Furthermore, the amorphous silicon film 13x is formed into a crystalline silicon semiconductor film by using an emitting excimer laser (S110). For example, a thickness of the crystalline silicon semiconductor film may be equal to or larger than 30 nm and equal to or smaller than 70 nm.

Semiconductor Film Patterning Step

Figure 5E:
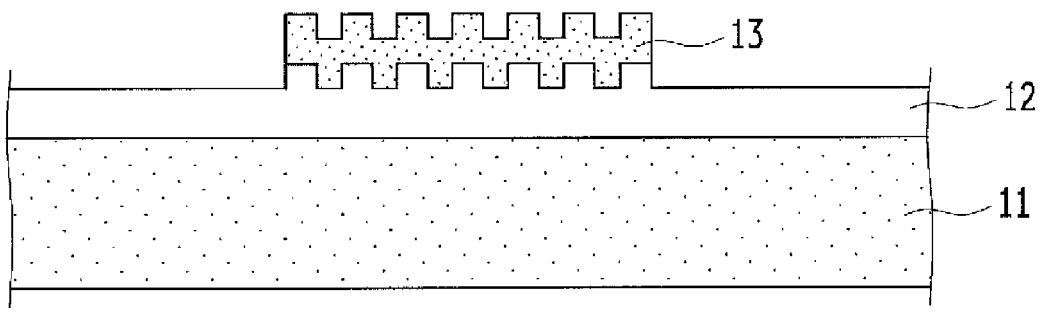
FIG. 5E is a process drawing illustrating manufacturing of the active matrix substrate according to the first embodiment.

A photoresist (a resist film) is applied (S111) and a crystalline silicon semiconductor film is patterned into an island-shaped crystalline silicon semiconductor film (here, a polysilicon film) as illustrated in FIG. 5E (S112 illustrated in FIG. 4B) by using a photolithography method. A dehydrogenation treatment is performed by performing a heat treatment on the island-shaped crystalline silicon semiconductor film. In the heat treatment, in a nitrogen atmosphere, for example, the heating temperature is 400° C. The amorphous oxide semiconductor film is formed into a crystalline oxide semiconductor (the semiconductor film 13) by using an excimer laser annealing method.

Gate Insulating Film Forming Step

Figure 5F:
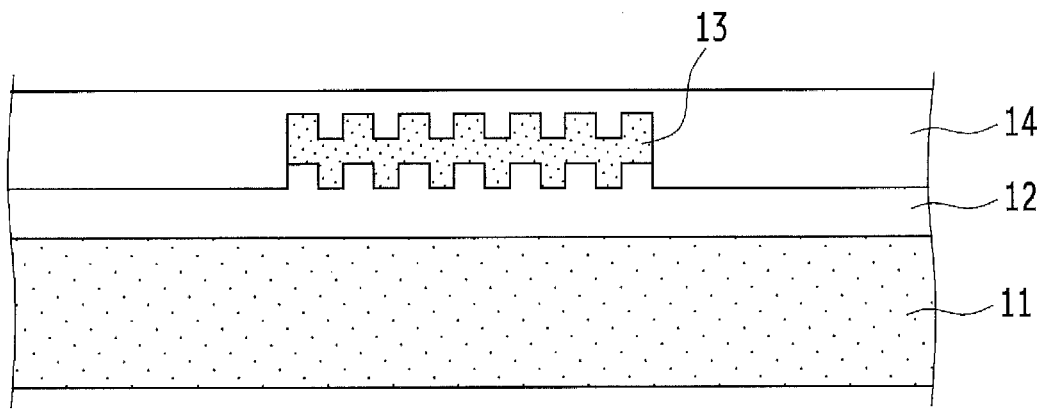
FIG. 5F is a process drawing illustrating manufacturing of the active matrix substrate according to the first embodiment.

Next, as illustrated in FIG. 5F, a gate insulating film 14 (a second inorganic insulating film) (of which the thickness is, for example, equal to or larger than 50 nm and equal to or smaller than 130 nm) is formed to cover the island-shaped crystalline silicon semiconductor film using a plasma CVD method (S113). For example, the gate insulating film 14 may be a $SiN_x$ film.

Gate Metal Film Forming Step

Next, although not illustrated in the drawing, a gate metal film is formed by using a sputtering method (S114). For example, the gate metal film may be a metal film containing an element selected from materials such as Al, W, Mo, Ta, Cr, Cu, Ti, and the like or an alloy film containing such elements as components. When the gate metal film is formed using a layered film, the gate metal film, for example, may be Ti/Al/Ti, Ti/Al/Mo, or the like.

Gate Electrode Patterning Step

Figure 5G:
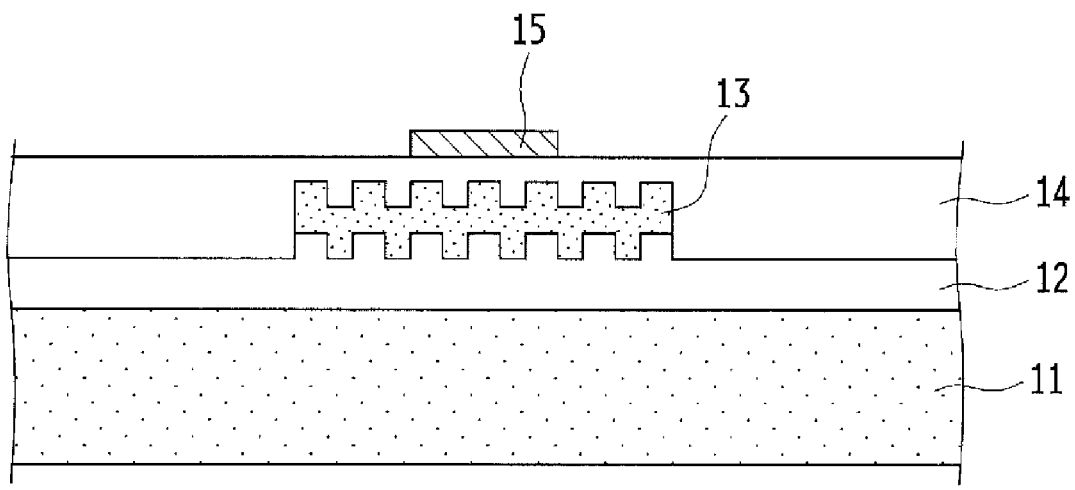
FIG. 5G is a process drawing illustrating manufacturing of the active matrix substrate according to the first embodiment.

Next, a photoresist (a resist film) is applied (S115), and the gate electrode 15 is patterned, as illustrated in FIG. 5G, using a photolithography method (S116).

Impurity Doping Process Step

Next, in order to form source regions 13a and 13a and a drain region (not illustrated) of the semiconductor film 13, the semiconductor film 13 is heavily doped with impurities such as P (phosphorus) m N channel TFTs and impurities such as B (boron) in p-channel TFTs with the gate electrode 15 used as a mask by using an ion doping method, an ion implantation method, or the like (S117).

More specifically, impurities are injected into the island-shaped crystalline silicon semiconductor film using the gate electrode 15 as a doping mask, and a first impurity injection area (not illustrated) is formed (a first impurity doping step). Next, a resist mask (not illustrated) is formed, and impurities are further injected into a part of the first impurity injection area using the formed resist mask as a doping mask, whereby source regions 13a and 13a and a drain region (not illustrated) (doped region) are formed (a second impurity doping step).

A region of the first impurity injection area in which impurities have not been injected in the second impurity doping step becomes a lightly doped drain (LDD) region. In addition, a region of the island-shaped crystalline silicon semiconductor film in which impurities have not been injected in both the two impurity doping steps becomes an active region (a channel region 13b).

Third Inorganic Insulating Film Forming Step

Next, a third inorganic insulating film forming the interlayer film 16 is formed using a plasma CVD method (S118). According to an aspect, for example, the third inorganic insulating film may be formed using a single-layer film or a layered film made of silicon nitride, silicon oxide, silicon oxynitride, or the like.

Wiring Patterning Step

Figure 5H:
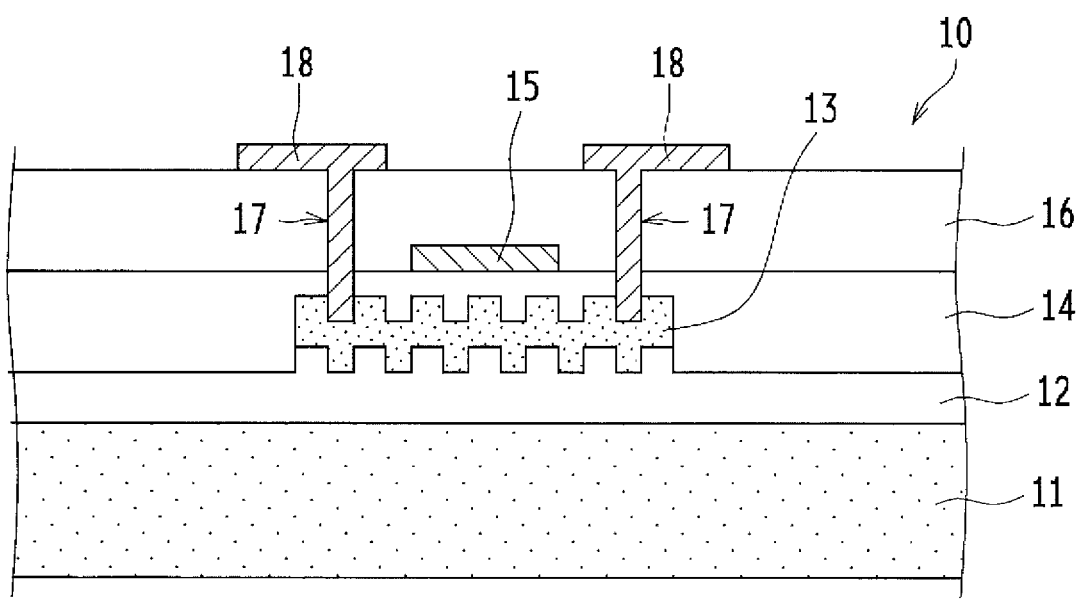
FIG. 5H is a process drawing illustrating manufacturing of the active matrix substrate according to the first embodiment.

A metal film (M3) is formed on the third inorganic insulating film using a sputtering method (S119). For example, the metal film is a metal film containing an element selected from materials such as Al, W, Mo, Ta, Cr, Cu, Ti, and the like or an alloy film containing such elements as components. For example, in a case where the metal film is formed using a layered film, the metal film may be Ti/Al/Ti, Ti/Al/Mo, or the like. Next, a photoresist (a resist film) is applied (S120), and wiring is patterned and formed using a photolithography method (S121), Fourth Inorganic Insulating Film Forming Step Next, a fourth inorganic insulating film that forms the interlayer film 16 is formed using a plasma CND method (S122). According to an aspect, for example, the fourth inorganic insulating film may be formed using a single-layer film or a layered film made of silicon nitride, silicon oxide, silicon oxynitride, or the like, Hydrogenation Step Next, a hydrogenation treatment (a heat treatment) of the island-shaped crystalline silicon semiconductor film is performed at a heating temperature of approximately 400° C. through annealing, Contact Hole Patterning Step Next, a photoresist (a resist film) is applied (S124), and, as illustrated in FIG. 5H and FIG. 8, contact holes 17 and 17 are patterned for the interlayer film 16 (the fourth inorganic insulating film/the third inorganic insulating film)/the gate insulating film 14 (the second inorganic insulating film) using a photolithography method (S125).

Source Electrode and Drain Electrode Forming Step

A source metal film is formed using a sputtering method or the like (S126), For example, the source metal film may be a single-layer film, a layered film, or an alloy film using materials such as Ti, Al, Mo, Ta, W, and Cu. Examples of the layered film include Ti/Al/Mo, and the like.

Next, a photoresist (a resist film) is applied (S127), and the source metal film is patterned using a photolithography method, whereby source electrodes 18 and 18, a drain electrode (not illustrated), and source wiring (not illustrated) are patterned and formed (S128).

Flattened Film Applying Step

Next, a flattened film is applied (S129). For example, the flattened film may be a polyimide resin film or an acrylic resin film.

Metal Film Forming Step for Anode Electrode

A metal film for anode electrodes is formed on a flattened film using a sputtering method (S130). According to an aspect, for example, the metal film for anode electrodes may be formed using a layered film of indium tin oxide (ITO) and silver (Ag) or an alloy containing Ag and has light reflectivity.

Anode Electrode Patterning Step

A photoresist (a resist film) is applied (S131) and anode electrodes (not illustrated) are patterned using a photolithography method. Consequently, an active matrix substrate 10 is acquired.

Second Embodiment

In a method for manufacturing an active matrix substrate 10 according to a second embodiment, an underlayer inorganic insulating film 12 includes a flattened area 12b (see FIG. 11 to be described below), A roughened area patterning step of patterning a roughened area 12a (see FIG. 11) in an area that is within the flattened area 12b and that entirely overlaps a semiconductor film 13 forming transistors is included.

In the active matrix substrate 10 according to the second embodiment, an underlayer inorganic insulating film 12, a semiconductor film 13, a gate insulating film 14, and a gate electrode 15 are formed on a substrate 11 in that order. The underlayer inorganic insulating film 12 includes a roughened area 12a and a flattened area 12b. The roughened area 12a is formed on a rough surface that is rougher than the flattened area 12b. The surface of the semiconductor film 13 that overlaps the roughened area 12a is roughened following the rough surface of the underlayer inorganic insulating film 12. In the active matrix substrate 10 according to the second embodiment, the roughened area 12a is formed to entirely overlap the semiconductor film 13 forming transistors. In this way, the active matrix substrate 10 can be easily manufactured.

Figure 9A:
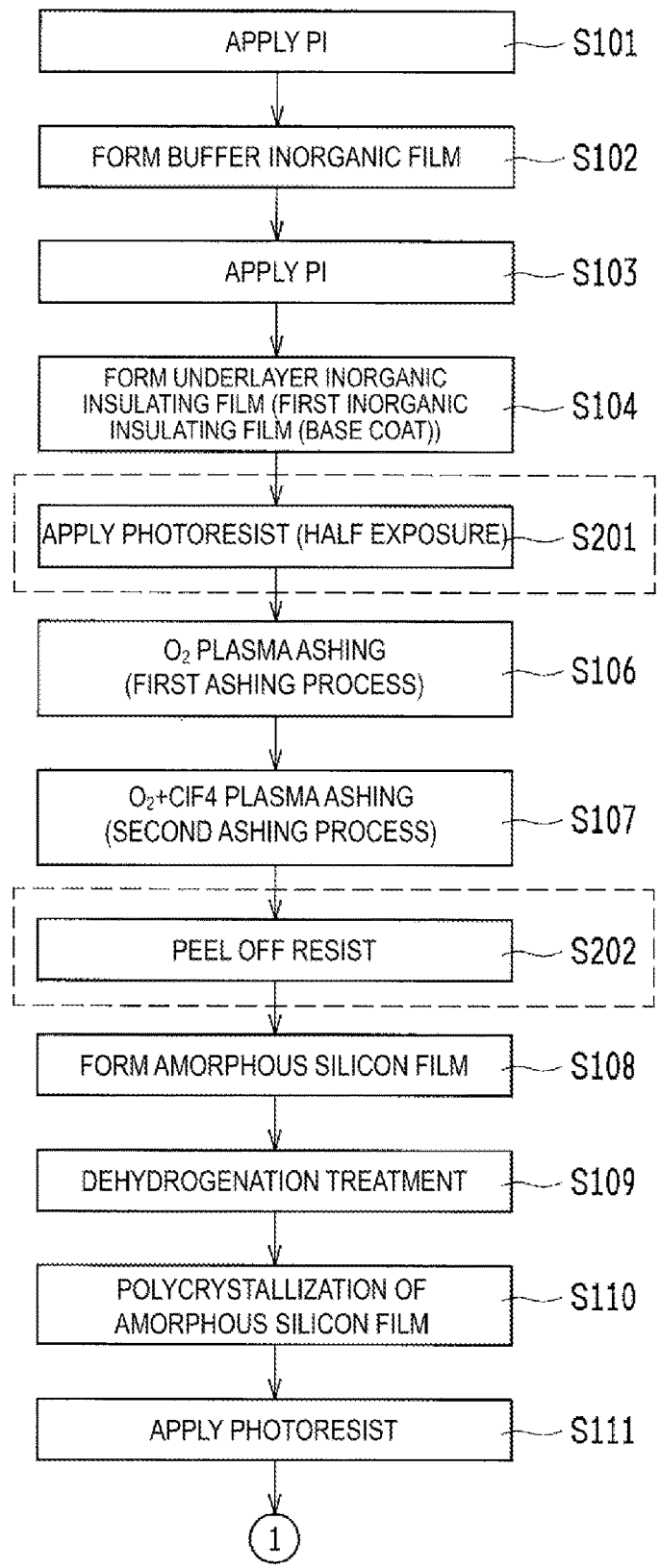
FIG. 9A is a flowchart for manufacturing an active matrix substrate according to a second embodiment.
Figure 9B:
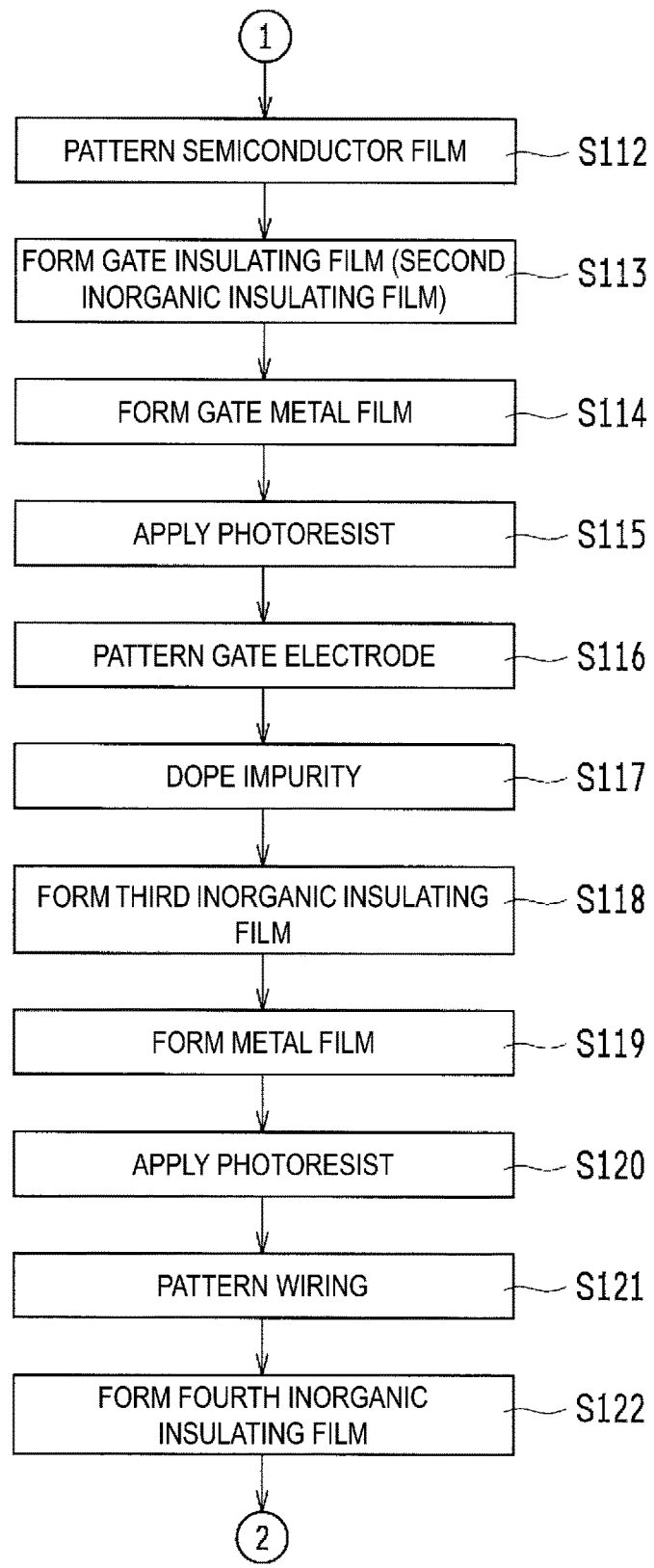
FIG. 9B is a flowchart for manufacturing the active matrix substrate according to the second embodiment.
Figure 9C:
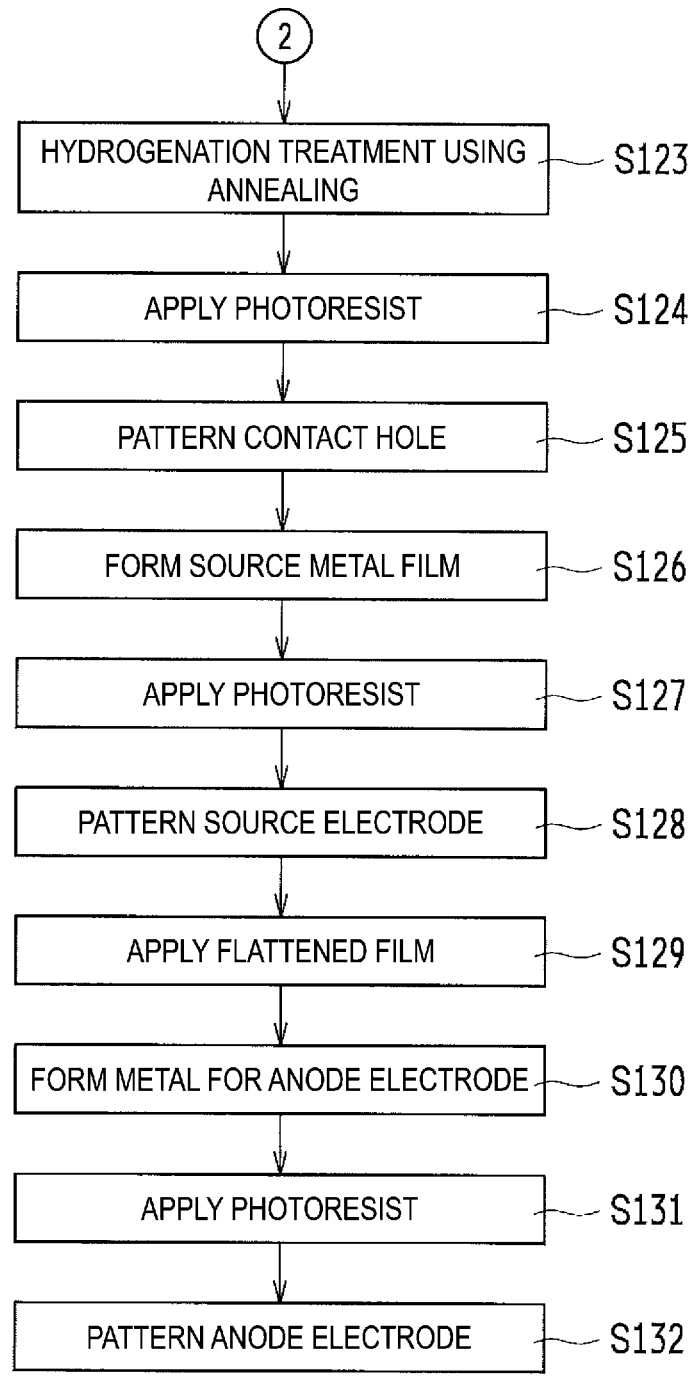
FIG. 9C is a flowchart for manufacturing the active matrix substrate according to the second embodiment.

FIGS. 9A to 9C are flowcharts illustrating steps of manufacturing the active matrix substrate 10 according to the second embodiment. FIGS. 10A to 10I are process drawings illustrating a portion corresponding to a roughened area 12a in each step of manufacturing the active matrix substrate 10 according to the second embodiment. FIG. 11 is a plan view illustrating the underlayer inorganic insulating film 12 roughened in the process illustrated in FIG. 10D together with a semiconductor film 13, a gate electrode 15, and a contact hole 17, In FIG. 11, diagonal lines represent the roughened area 12a, and the remainder represents a flattened area 12b.

In the method for manufacturing the active matrix substrate 10 according to the second embodiment, steps illustrated in FIG. 10B, FIG. 10C, and FIGS. 10E to 10I are substantially the same as the steps of the manufacturing method according to the first embodiment that are illustrated in FIG. 5A, FIG. 5B, and FIGS. 5D to 5H. In addition, in the flowchart illustrated in FIG. 9A, S201 is provided instead of S105 of the flowchart of the manufacturing method according to the first embodiment illustrated in FIG. 4A, and S202 is provided between S107 and S108, and the other flowcharts are substantially the same as the flowcharts illustrated in FIGS. 4A to 4C. Thus, steps illustrated in FIGS. 10A and 10D, and S201 and S202 illustrated in FIG. 9A will be mainly described.

Underlayer Inorganic Insulating Film Forming Step

After a polyimide (PI) film has been applied onto a substrate such as glass (S101 in FIG. 9A) and the polyimide (PI) film is cured, a buffer inorganic film is formed (S102 illustrated in FIG. 9A), and the polyimide (PI) film is applied (S103 illustrated in FIG. 9A) and cured again, whereby a substrate 11 having flexibility is acquired by being peeled off a base material. In a case where the substrate 11 does not require flexibility, glass having a flat plate shape can be also used as the substrate 11. Thereafter, the underlayer inorganic insulating film 12 (a first inorganic insulating film) is formed on the substrate 11 (S104 illustrated in FIG. 9A).

Resist Application (Half Exposure Step)

Figure 10A:
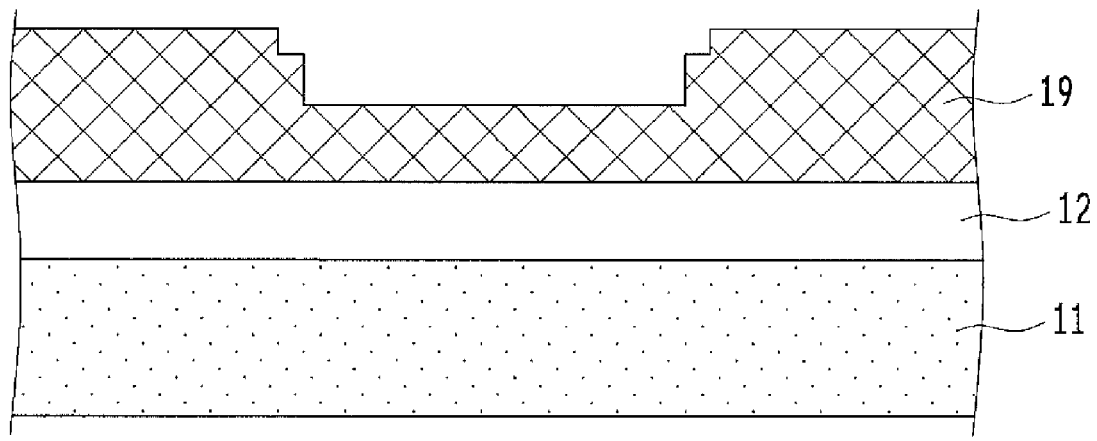
FIG. 10A is a process drawing of a roughened area part in the manufacturing of the active matrix substrate according to the second embodiment.
Figure 10B:
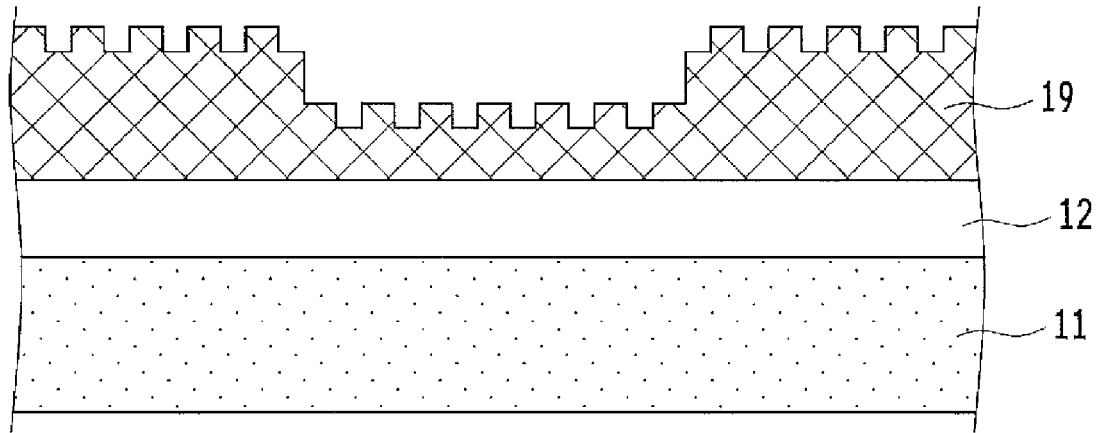
FIG. 10B is a process drawing of the roughened area part in the manufacturing of the active matrix substrate according to the second embodiment.
Figure 10C:
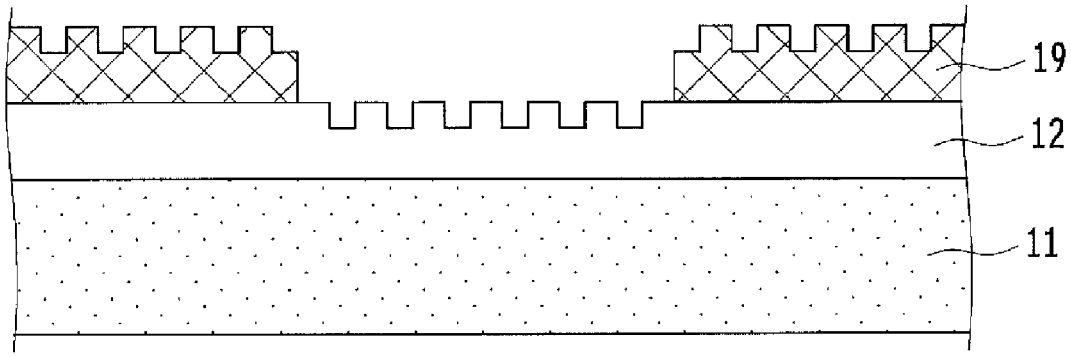
FIG. 10C is a process drawing of the roughened area part in the manufacturing of the active matrix substrate according to the second embodiment.
Figure 11:
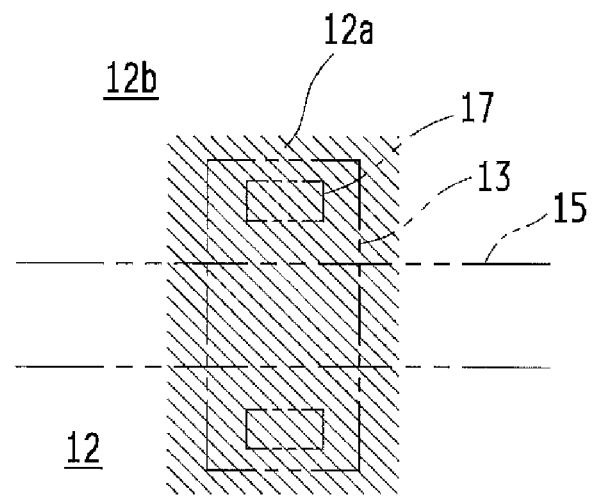
FIG. 11 is a plan view illustrating an underlayer inorganic insulating film roughened in the process illustrated in FIG. 10D together with a semiconductor film, a gate electrode, and a contact hole.

As illustrated in FIG. 10A, after a resist 19 (photoresist) is applied onto the underlayer inorganic insulating film 12 using a slit coater, half exposure using a gray tone mask is performed (S201). The thickness of the resist 19 may be, for example, 1 µm to 2 µm.

Resist Peeling

Figure 10D:
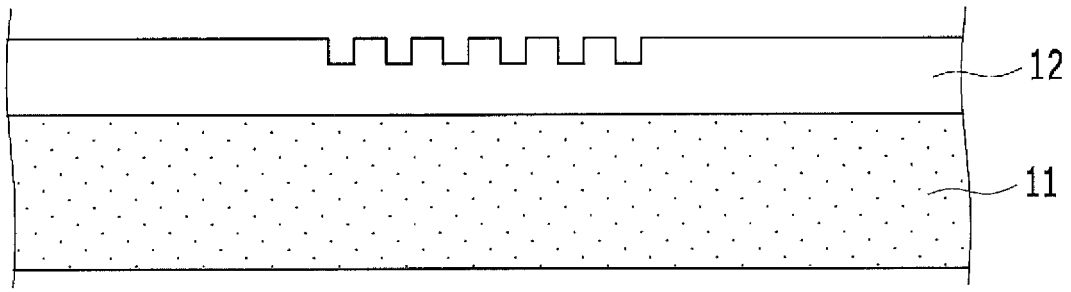
FIG. 10D is a process drawing of the roughened area part in the manufacturing of the active matrix substrate according to the second embodiment.
Figure 10E:
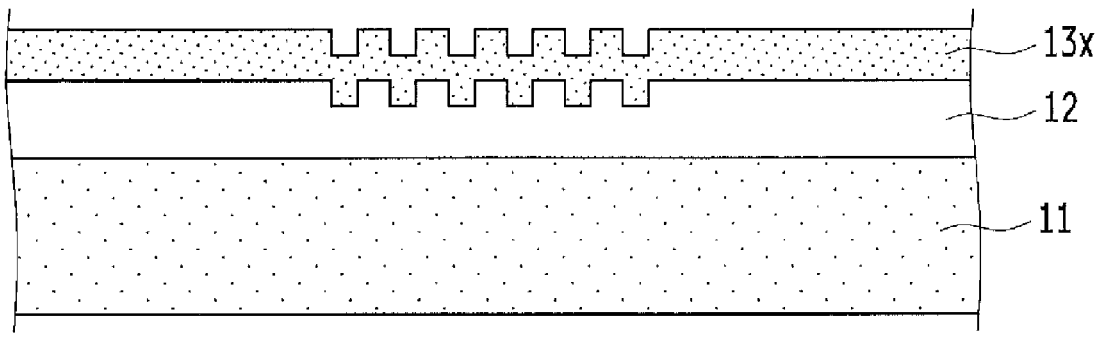
FIG. 10E is a process drawing of the roughened area part in the manufacturing of the active matrix substrate according to the second embodiment.
Figure 10F:
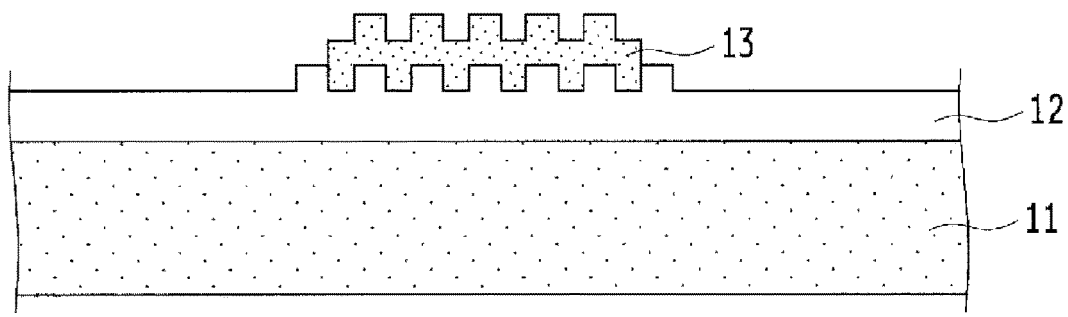
FIG. 10F is a process drawing of the roughened area part in the manufacturing of the active matrix substrate according to the second embodiment.
Figure 10G:
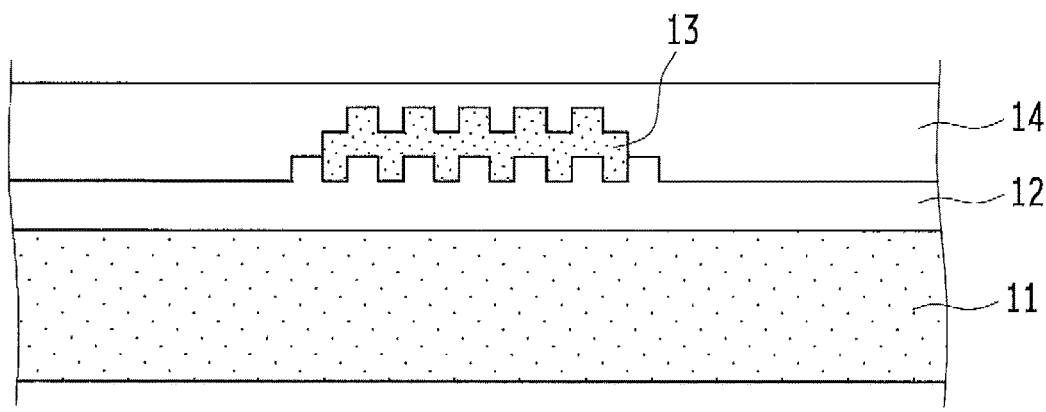
FIG. 10G is a process drawing of the roughened area part in the manufacturing of the active matrix substrate according to the second embodiment.
Figure 10H:
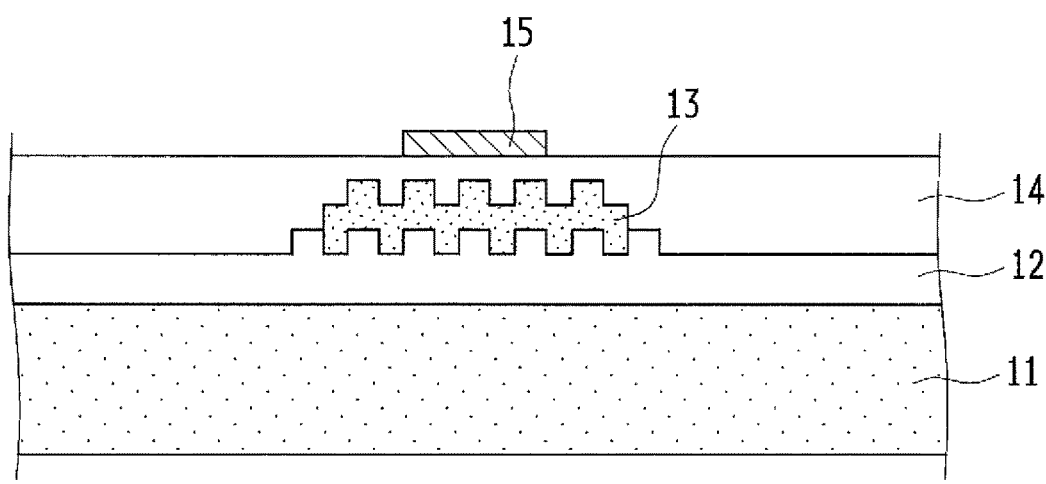
FIG. 10H is a process drawing of the roughened area part in manufacturing of the active matrix substrate according to the second embodiment.
Figure 10I:
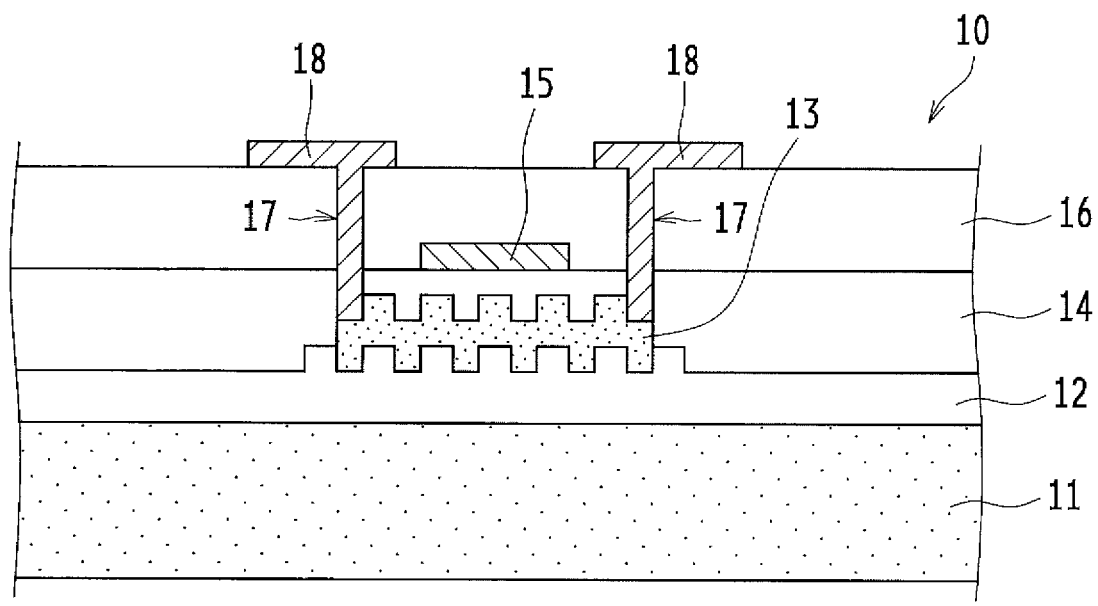
FIG. 10I is a process drawing of the roughened area part in the manufacturing of the active matrix substrate according to the second embodiment.

As illustrated in FIG. 10D, the entirety of the resist 19 is peeled off using a known technique of the related art (S202).

Pixel Circuit

Next, a pixel circuit 20 of a part of the organic EL display device 100 of the active matrix-type will be described.

Figure 12:
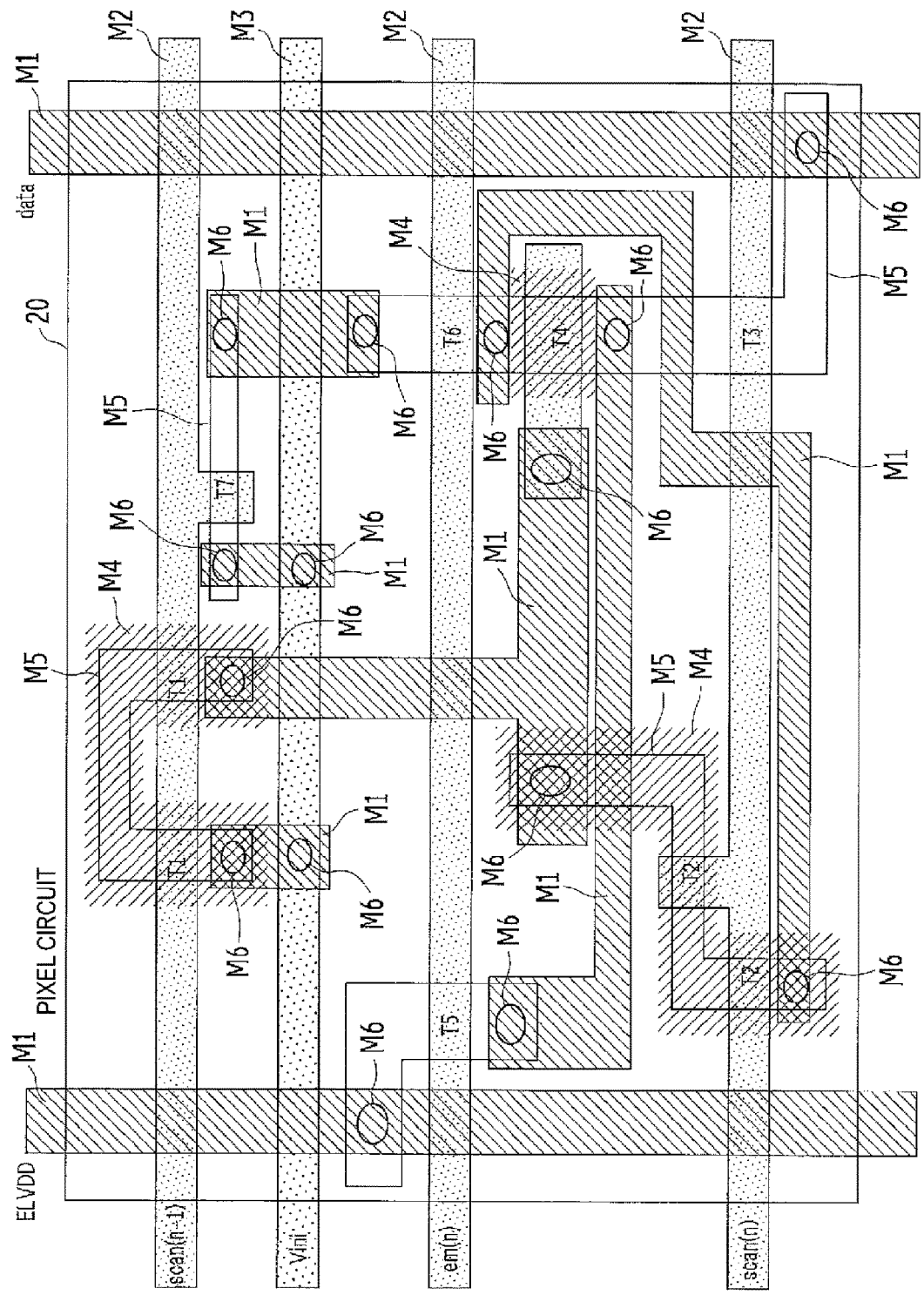
FIG. 12 is a plan view illustrating an example of a pixel circuit of a part of an organic EL display device of an active matrix type.
Figure 13:
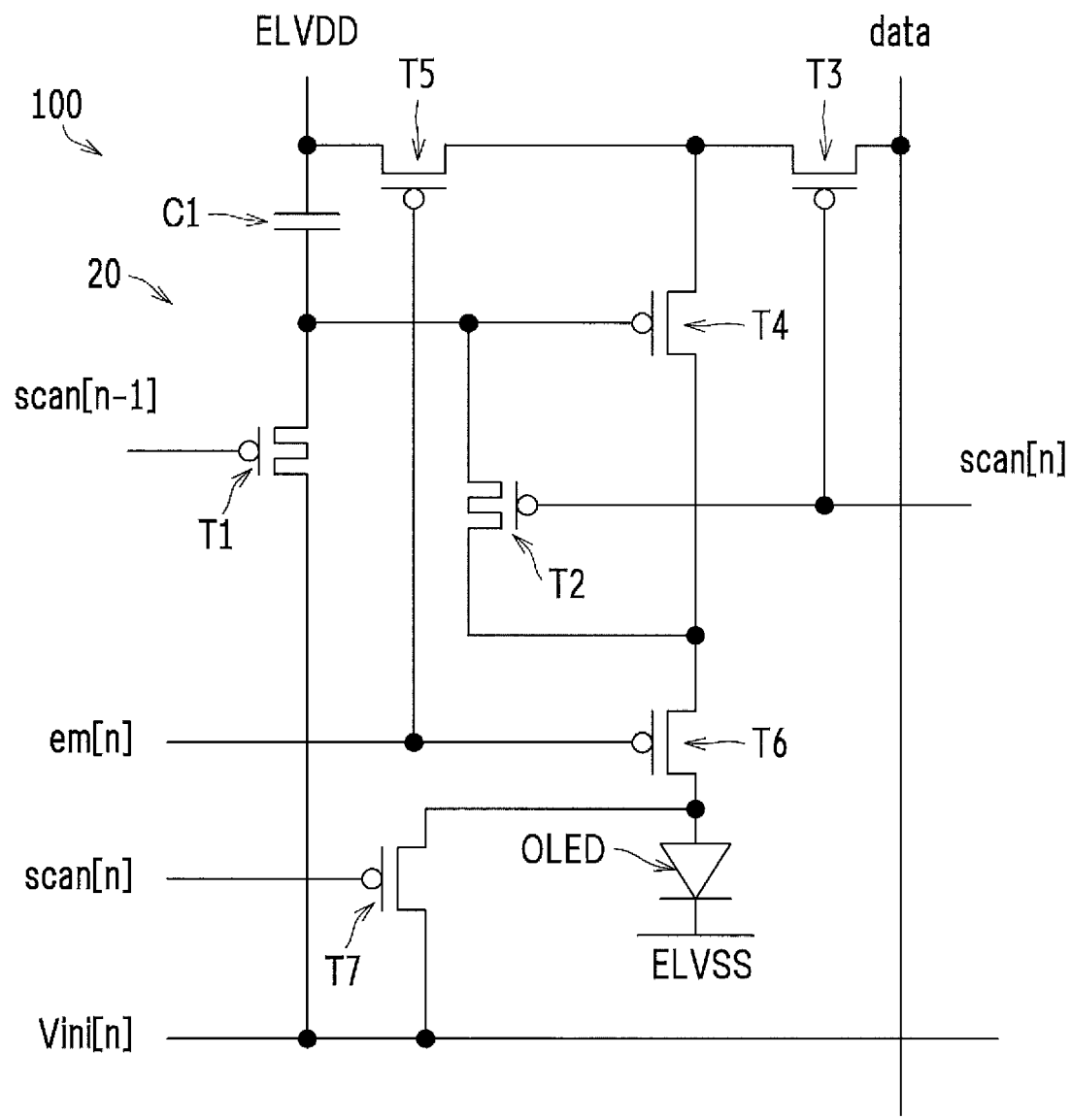
FIG. 13 is a circuit diagram of the pixel circuit illustrated in FIG. 12.

FIG. 12 is a plan view illustrating an example of the pixel circuit 20 of a part of the organic EL display device 100 of the active matrix type. In FIG. 12, reference signs M1, M2, M3, M4, M5, and M6 respectively represent a source array, a gate array, a wiring (a capacitance wiring array), a roughened base coat (an underlayer inorganic insulating film 12), a semiconductor film 13, and a contact hole 17. FIG. 13 is a circuit diagram of the pixel circuit 20 illustrated in FIG. 12.

As illustrated in FIG. 12 and FIG. 13, the pixel circuit 20 includes an organic EL element OLED, an initialization transistor T1 for a drive transistor, a threshold-voltage-compensation transistor T2, a write transistor T3, a drive transistor T4, a power supply control transistor T5, a light emission control transistor T6, an initialization transistor T7 for a light emission element, and a capacitor C1.

A scanning line scan[n] (a current scanning line) (here, n is an integer equal to or larger than 2), a scanning line scan [n−1] that is immediately prior to the current scanning line scan [n] (a preceding scanning line), an emission line em [n], data line data, a high-level power source line ELVDD, a low-level power source line ELVSS, and an initialization line Vini [n] are connected to the pixel circuit 20.

The initialization transistor T1 for a drive transistor is provided between a gate terminal of the drive transistor T4 and the initialization line Vini [n] and has a gate terminal connected to the preceding scanning line scan [n−1]. The initialization transistor T1 for a drive transistor initializes a gate potential of the drive transistor T4 in accordance with selection of the preceding scanning line scan [n−1].

The threshold voltage compensation transistor T2 is provided between the gate terminal and a drain terminal of the drive transistor T4 and has a gate terminal connected to the current scanning line scan [n]. The threshold voltage compensation transistor T2 causes the drive transistor T4 to be in a diode connection in accordance with selection of the current scanning line scan [n].

The write transistor T3 has a gate terminal connected to the current scanning line scan [n] and a source terminal connected to the data line data. The write transistor T3 supplies a data voltage to the drive transistor T4 in accordance with selection of the current scanning line scan [n].

The drive transistor T4 has a source terminal connected to a drain terminal of the write transistor T3 and supplies a drive current corresponding to a source-to-gate voltage maintained in the capacitor C1 to the light emission control transistor T6.

The power supply control transistor T5 is provided between the high-level power source line ELVDD and a source terminal of the drive transistor T4 and has a gate terminal connected to the emission line em [n]. The power supply control transistor T5 supplies the high-level power source electric potential to the source terminal of the drive transistor T4 in accordance with selection of the emission line em [n].

The light emission control transistor T6 is provided between the drain terminal of the drive transistor T4 and the organic EL element OLED and has a gate terminal connected to the emission line em [n]. The light emission control transistor T6 delivers a drive current to the organic EL element OLED in accordance with selection of the emission line em [n].

The organic EL element OLED has an anode terminal connected to the drain terminal of the drive transistor T4 and a cathode terminal connected to the low-level power source line ELVSS. The organic EL element OLED emits light with a luminance corresponding to a drive current.

Here, in order to reduce the S value of the drive transistor T4, an area of the underlayer inorganic insulating film 12 that overlaps at least the gate electrode 15 is roughened (formed to have irregularities). In the other switching transistors (particularly the write transistor T3), although an area overlapping the gate electrode 15 may not be roughened (formed to have irregularities), in order to decrease leakage of the capacitor C1, it is preferable that an area overlapping the gate electrode 15 be roughened (formed to have irregularities) also in the initialization transistor T1 for a drive transistor and the threshold voltage compensation transistor T2. Furthermore, also in the initialization transistor T1 for a drive transistor and a doped area (also functioning as wiring) of the threshold voltage-compensation transistor T2, it is preferable that an area overlapping the gate electrode 15 be formed as a roughened area 12a (an area having irregularities). By doing so, the roughened area 12a can be used as a resistor. For example, by forming a film using a sputtering method, wiring length can be increased.

Third Embodiment: Modified Example of Second Embodiment

A method for manufacturing an active matrix substrate 10 according to a third embodiment includes a roughened area patterning step of patterning a roughened area 12a that overlaps a semiconductor film 13 that overlaps at least a gate electrode 15; and a doped area patterning step of patterning and forming a doped area of the semiconductor film 13 such that a flattened area 12b and at least a part (all or a part) of the doped area of the semiconductor film 13 overlap each other. The active matrix substrate 10 according to the third embodiment includes an interlayer film 16 and a source electrode 18 in order from a face of a gate electrode 15 that is on the opposite side to the substrate 11. The roughened area 12a is formed to overlap at least the semiconductor film 13 that overlaps at least the gate electrode 15. The semiconductor film 13 is electrically connected to the source electrode 18 via a contact hole 17 formed in a gate insulating film 14 and the interlayer film 16 and overlaps at least the contact hole 17 and the flattened area 12b. By doing so, the roughened area 12a can be partially formed in an underlayer inorganic insulating film 12.

In a pixel circuit 20, a doped area of polycrystalline low-temperature polysilicon (LTPS) may be used as wiring (more specifically, wiring used by the pixel circuit 20 for connecting a source terminal and a drain terminal between different TFTs). In such a case, it is preferable that a rough surface (a surface having irregularities) be not provided in such wiring. In the circuit diagrams illustrated in FIG. 12 and FIG. 13, examples of combinations of different TFTs include a combination of a drive transistor T4—a power supply control transistor T5, a combination of a write transistor T3—the drive transistor 14, a combination of an initialization transistor T1 for a drive transistor—a threshold voltage compensation transistor T2, a combination of the threshold voltage compensation transistor T2—the drive transistor T4, and a combination of the drive transistor T4—a light emission control transistor T6.

FIGS. 14A to 14I are process drawings illustrating a portion corresponding to a roughened area 12a in steps of manufacturing of an active matrix substrate 10 according to the third embodiment. FIG. 15 is a plan view illustrating an underlayer inorganic insulating film 12 roughened in the process illustrated in FIG. 14D together with a semiconductor film 13, a gate electrode 15, and a contact hole 17. FIGS. 16A to 16I are process drawings illustrating a portion corresponding to a flattened area 12b in steps of the manufacturing of the active matrix substrate 10 according to the third embodiment. FIG. 17 is a plan view illustrating an underlayer inorganic insulating film 12 roughened in the step illustrated in FIG. 16D together with a semiconductor film 13, a gate electrode 15, and a contact hole 17, In FIG. 15 and FIG. 17, diagonal lines represent the roughened area 12a and, the remainder represents the flattened area 12b.

The flow representing each step of manufacturing the active matrix substrate 10 according to the third embodiment is substantially the same as the flow representing each step of manufacturing the active matrix substrate 10 according to the second embodiment illustrated in FIGS. 9A to 9C. Furthermore, each step of manufacturing the active matrix substrate 10 according to the third embodiment illustrated in FIGS. 14B to 14I and FIGS. 16B to 16I is substantially the same as each step of manufacturing the active matrix substrate 10 according to the second embodiment illustrated in FIGS. 10B to 10I. Thus, steps illustrated in FIGS. 14A and 16A will be described.

Resist Application (Half Exposure Step)

Figure 14A:
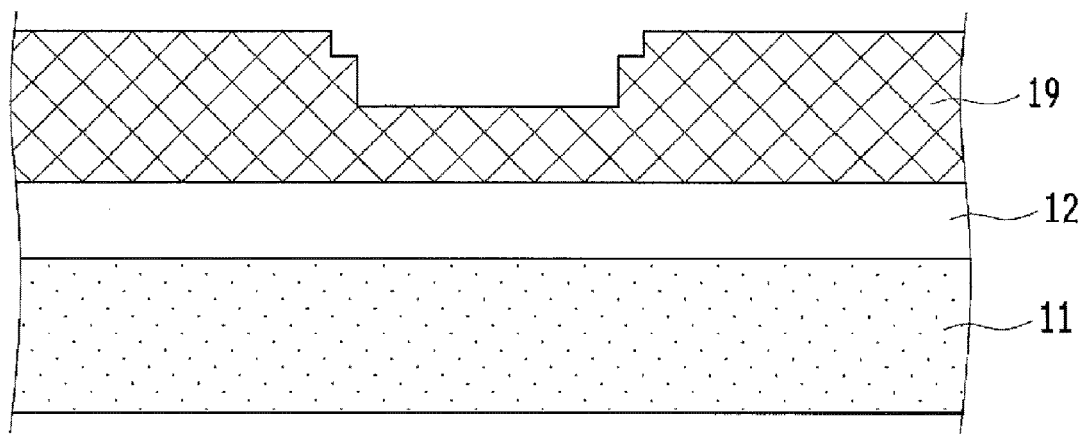
FIG. 14A is a process drawing of a roughened area part in the manufacturing of an active matrix substrate according to a third embodiment.
Figure 14B:
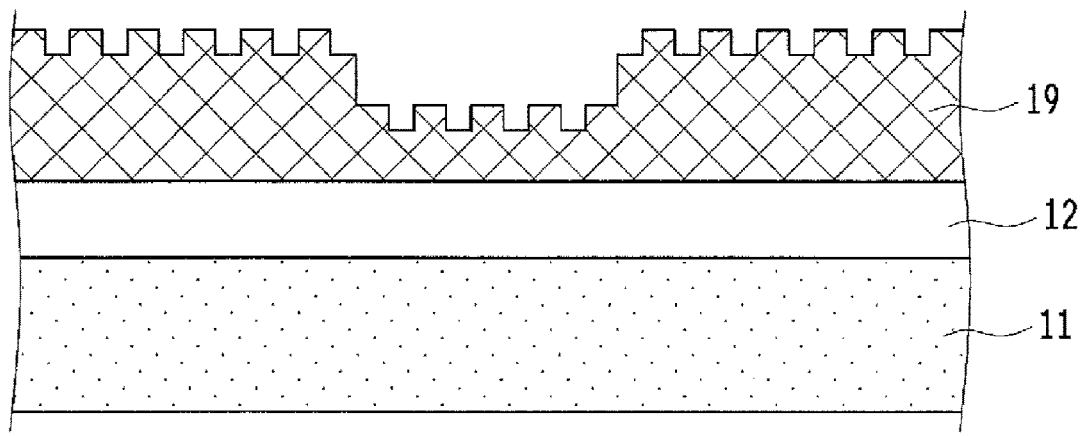
FIG. 14B is a process drawing of the roughened area part in the manufacturing of the active matrix substrate according to the third embodiment.
Figure 14C:
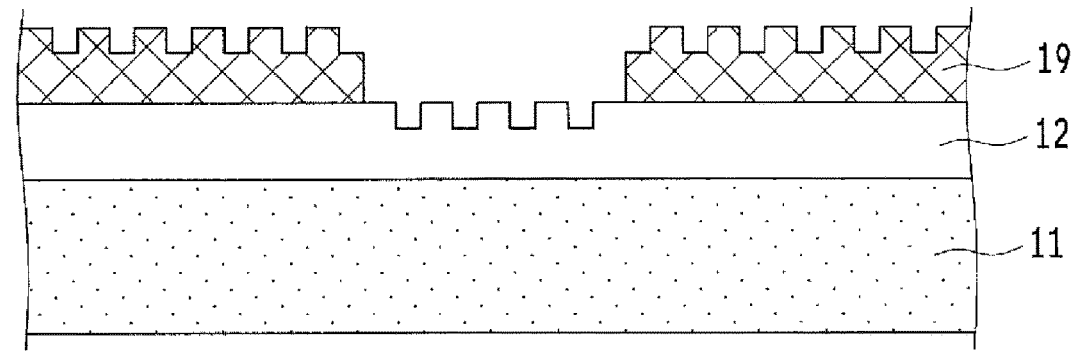
FIG. 14C is a process drawing of the roughened area part in the manufacturing of the active matrix substrate according to the third embodiment.
Figure 14D:
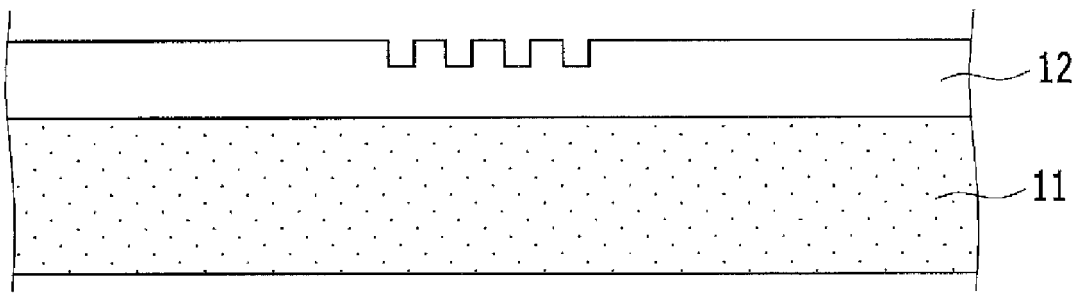
FIG. 14D is a process drawing of the roughened area part in the manufacturing of the active matrix substrate according to the third embodiment.
Figure 14E:
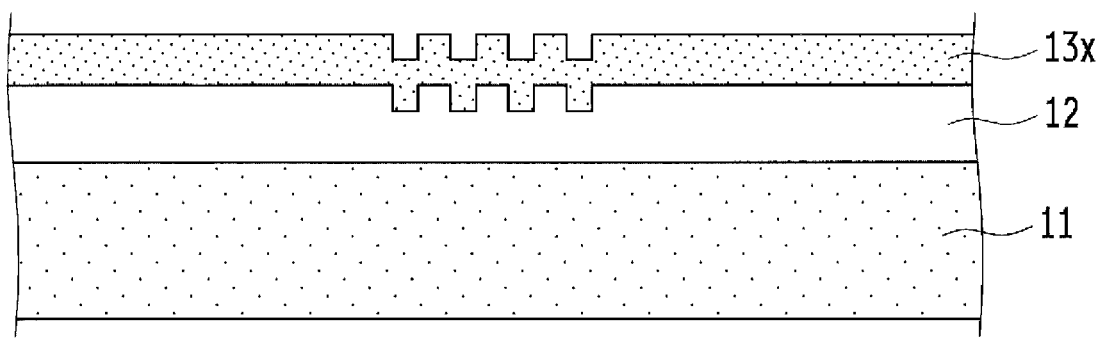
FIG. 14E is a process drawing of the roughened area part in the manufacturing of the active matrix substrate according to the third embodiment.
Figure 14F:
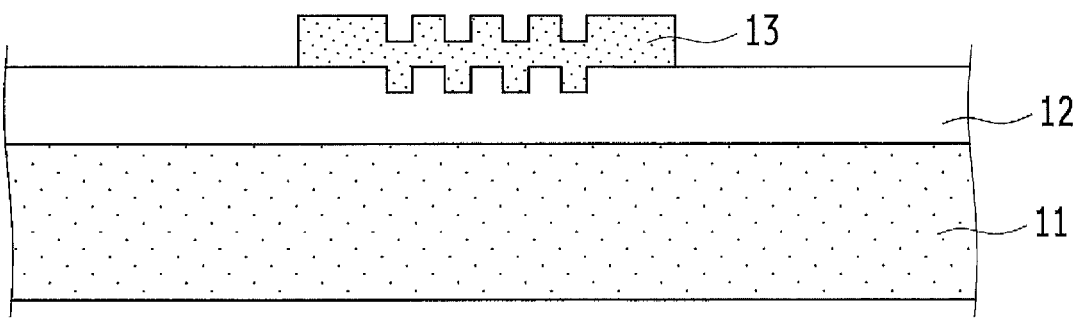
FIG. 14F is a process drawing of the roughened area part in the manufacturing of the active matrix substrate according to the third embodiment.
Figure 14G:
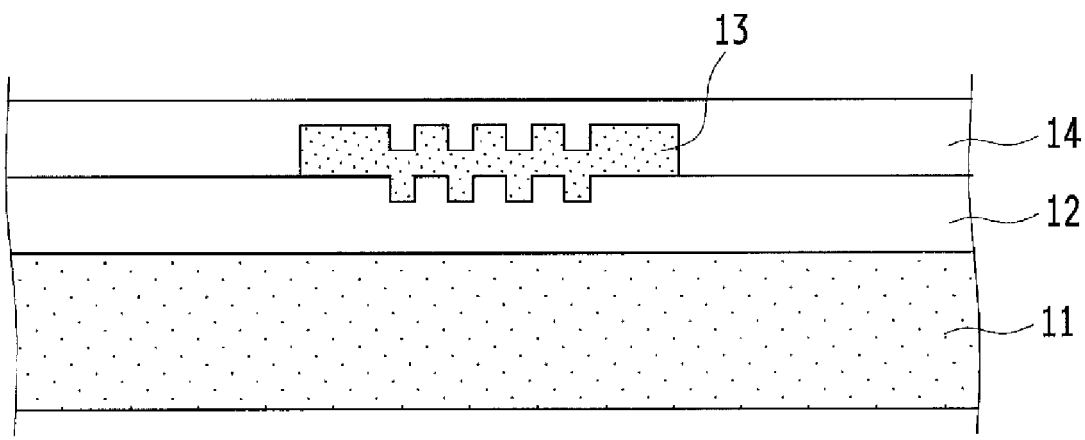
FIG. 14G is a process drawing of the roughened area part in the manufacturing of the active matrix substrate according to the third embodiment.
Figure 14H:
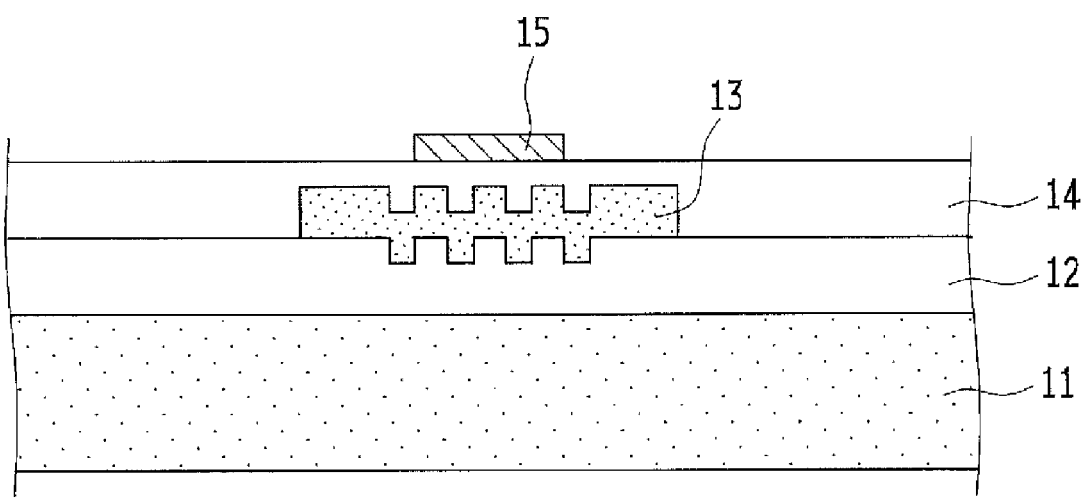
FIG. 14H is a process drawing of the roughened area part in the manufacturing of the active matrix substrate according to the third embodiment.
Figure 14I:
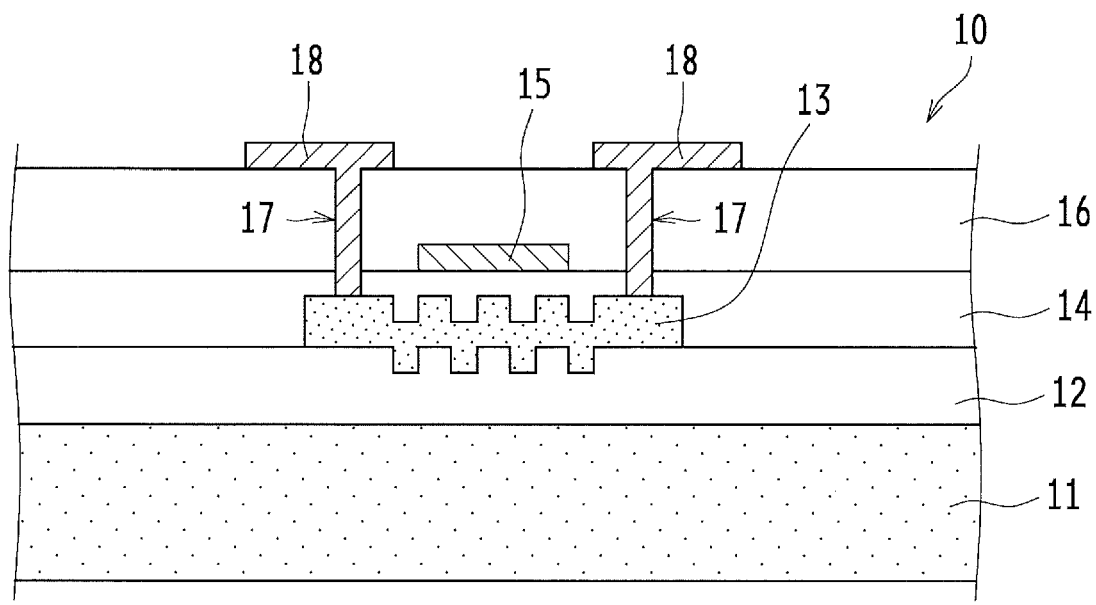
FIG. 14I is a process drawing of the roughened area part in the manufacturing of the active matrix substrate according to the third embodiment.
Figure 15:
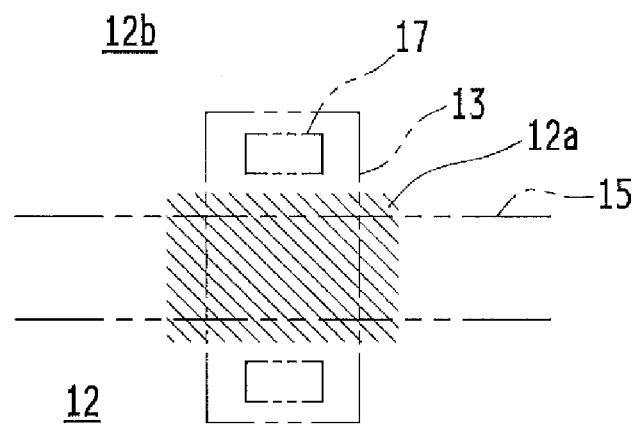
FIG. 15 is a plan view illustrating an underlayer inorganic insulating film roughened in the process illustrated in FIG. 14B together with a semiconductor film, a gate electrode, and a contact hole.
Figure 16A:
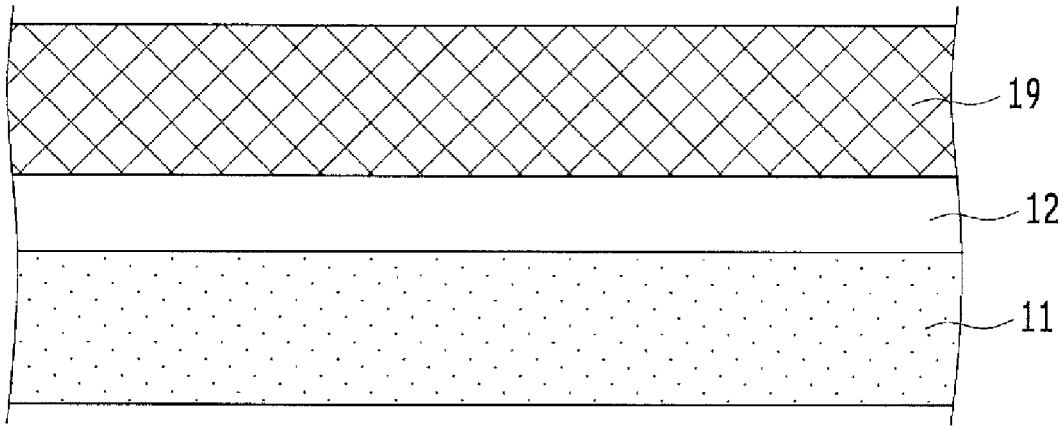
FIG. 16A is a process drawing of a flattened area part in the manufacturing of the active matrix substrate according to the third embodiment.
Figure 16B:
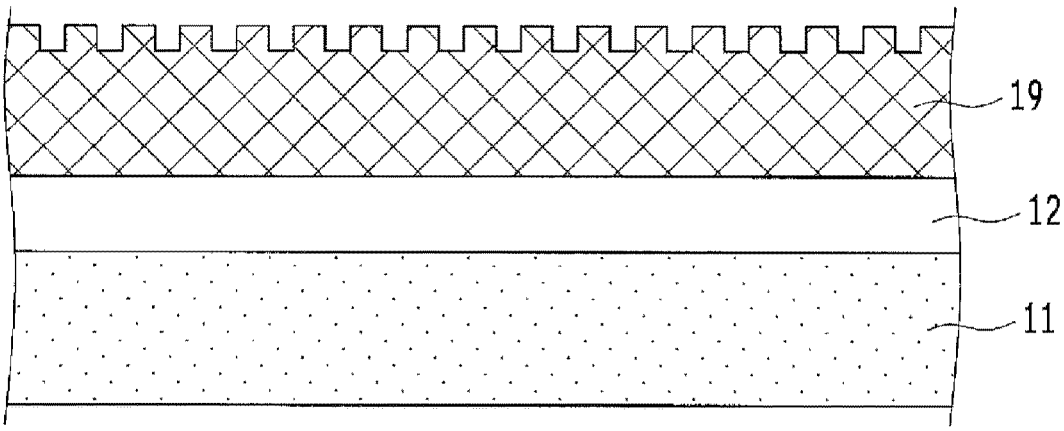
FIG. 16B is a process drawing of the flattened area part in the manufacturing of the active matrix substrate according to the third embodiment.
Figure 16C:
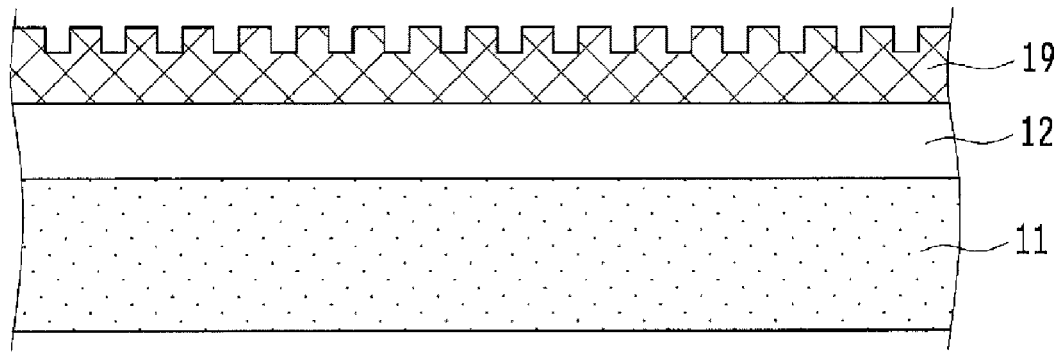
FIG. 16C is a process drawing of the flattened area part in the manufacturing of the active matrix substrate according to the third embodiment.
Figure 16D:
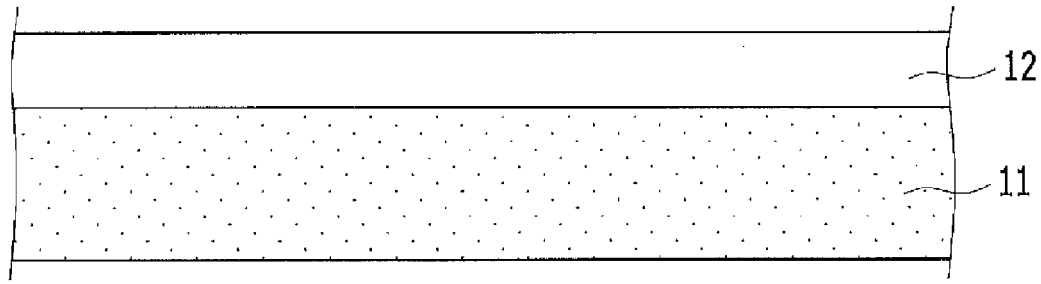
FIG. 16D is a process drawing of the flattened area part in the manufacturing of the active matrix substrate according to the third embodiment.
Figure 16E:
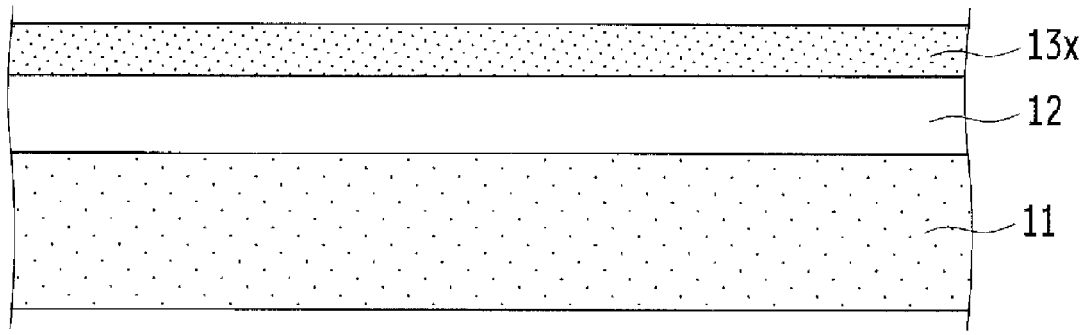
FIG. 16E is a process drawing of the flattened area part in the manufacturing of the active matrix substrate according to the third embodiment.
Figure 16F:
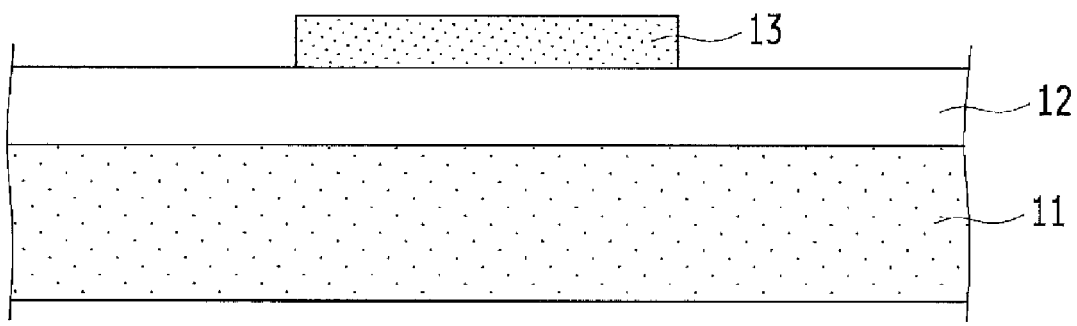
FIG. 16F is a process drawing of the flattened area part in the manufacturing of the active matrix substrate according to the third embodiment.
Figure 16G:
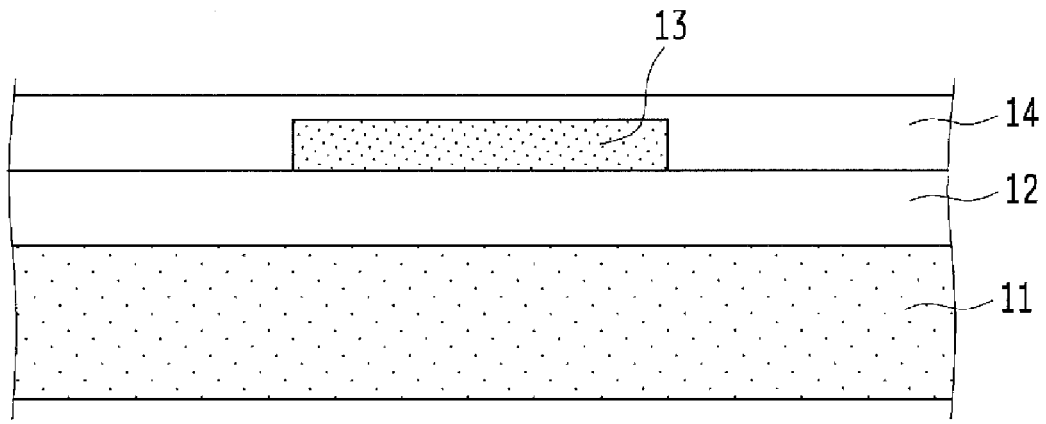
FIG. 16G is a process drawing of the flattened area part in the manufacturing of the active matrix substrate according to the third embodiment.
Figure 16H:
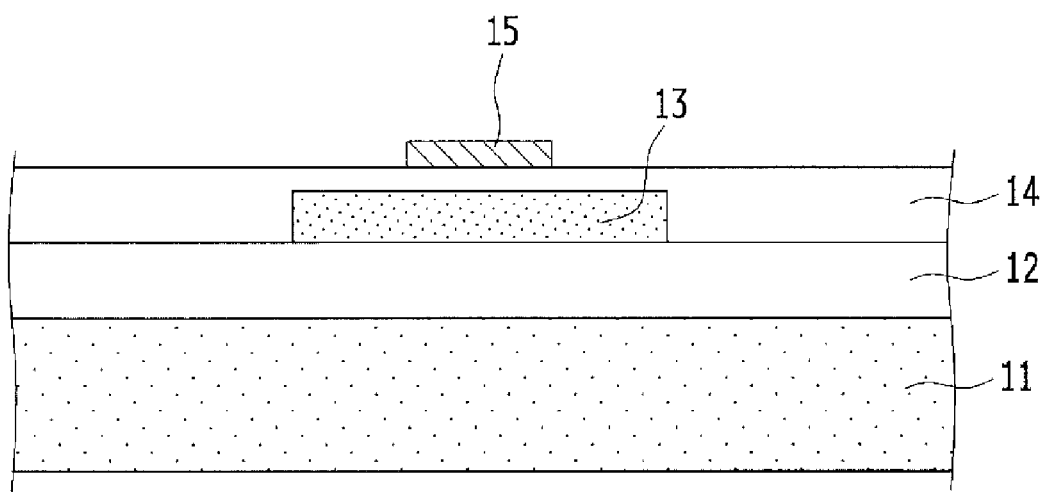
FIG. 16H is a process drawing of the flattened area part in the manufacturing of the active matrix substrate according to the third embodiment.
Figure 16I:
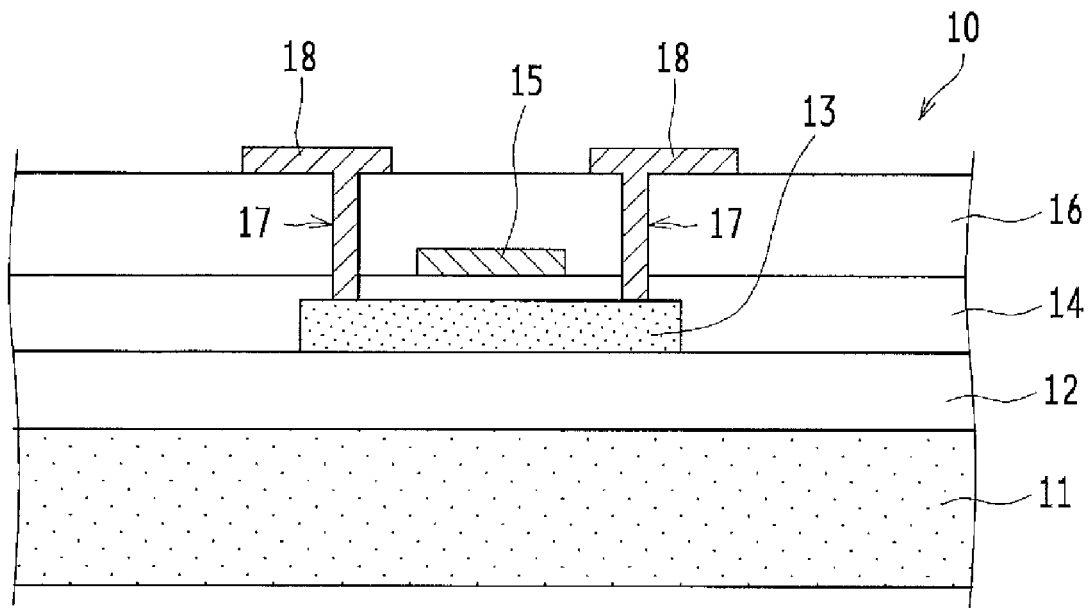
FIG. 16I is a process drawing of the flattened area part in the manufacturing of the active matrix substrate according to the third embodiment.
Figure 17:
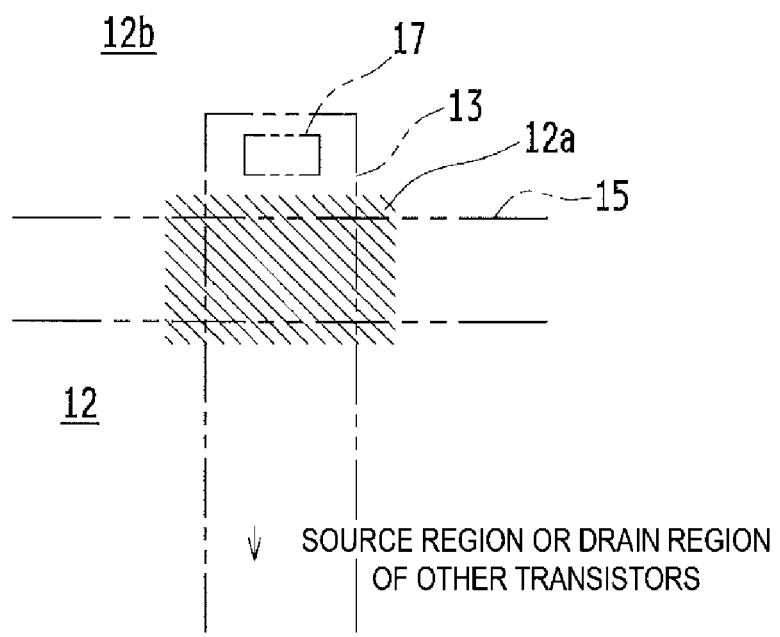
FIG. 17 is a plan view illustrating an underlayer inorganic insulating film roughened in the process illustrated in FIG. 16D together with a semiconductor film, a gate electrode, and a contact hole.

As illustrated in FIG. 14A, within a pixel, similar to S201 according to the second embodiment, only a drive transistor T4 is roughened (formed to have irregularities), and, as illustrated in FIG. 16A, roughening (forming irregularities) is not performed in the other transistors. For example, transistors disposed in a display area (a pixel area) are roughened (formed to have irregularities), and transistors disposed in a gate driver monolithic (GDM) area and a source shared driving (SSD) area are not roughened (formed to have irregularities).

Regarding Second Embodiment and Third Embodiment

In the methods for manufacturing the active matrix substrate 10 according to the second embodiment and the third embodiment, the gate electrode 15 and the roughened area 12a overlap each other. In addition, the step of providing the pixel circuit 20 including the drive transistor T4 that has the semiconductor film 13 of which at least a part (all or a part) overlaps a roughened area and the write transistor T3 in which the flattened area 12b and the gate electrode 15 overlap each other via the semiconductor film 13 is included. In the active matrix substrates 10 according to the second and third embodiments, the pixel circuit 20 including the drive transistor T4 and the write transistor T3 is provided. In the pixel circuit 20, the gate electrode 15 and the roughened area 12a overlap each other in the semiconductor film 13 forming the drive transistor T4, and the gate electrode 15 and the flattened area 12b overlap each other in the semiconductor film 13 forming the write transistor T3. In this way, in the active matrix substrate 10, in a state in which the write transistor T3 of which the semiconductor film 13 overlaps the gate electrode 15 and the flattened area 12b is provided, the drive transistor T4 of which the semiconductor film 13 overlaps the gate electrode 15 and the roughened area 12a can be provided.

The methods for manufacturing an active matrix substrate 10 according to the second embodiment and the third embodiment include a step of providing the semiconductor film 13, which is a continuous semiconductor film forming the write transistor T3 and the light emission control transistor T6 and at least a part (all or a part) of which overlaps the flattened area 12b between the light emission control transistor T6 and the write transistor T3. In the active matrix substrates 10 according to the second and third embodiments, the write transistor T3 and the light emission control transistor T6 are formed by the semiconductor film 13, which is continuous, and at least a part (all or a part) of the semiconductor film 13 between the light emission control transistor T6 and the write transistor T3 overlaps the flattened area 12b. In this way, in the active matrix substrate 10, the semiconductor film 13 that overlaps the flattened area 12b can be formed between the light emission control transistor T6 and the write transistor T3.

The methods for manufacturing an active matrix substrate 10 according to the second embodiment and the third embodiment include a step of providing the light emission control transistor T6 having the semiconductor film 13 that the gate electrode 15 and the flattened area 12b overlap. In the active matrix substrates 10 according to the second embodiment and the third embodiment, the gate electrode 15 and the flattened area 12b overlap each other in the semiconductor film 13 that forms the light emission control transistor T6. In this way, in the active matrix substrate 10, the flattened area 12b formed between the light emission control transistor T6 and the write transistor T3 can be used for the light emission control transistor T6.

The methods for manufacturing an active matrix substrate 10 according to the second embodiment and the third embodiment include a step of providing the initialization transistor T1 for a drive transistor having the semiconductor film 13 that the gate electrode 15 and the roughened area 12a overlap. In the active matrix substrates 10 according to the second embodiment and the third embodiment, the gate electrode 15 and the roughened area 12a overlap each other in the semiconductor film 13 that forms the initialization transistor T1 for a drive transistor. In this way, an area in which the semiconductor film 13 overlaps the gate electrode 15 and the roughened area 12a can be used as the initialization transistor T1 for a drive transistor.

The methods for manufacturing an active matrix substrate 10 according to the second embodiment and the third embodiment include a step of providing the initialization transistor Ti for a drive transistor having the semiconductor film 13 that entirely overlaps the roughened area 12a. In the active matrix substrates 10 according to the second and third embodiments, in the semiconductor film 13 that forms the initialization transistor T1 for a drive transistor, the semiconductor film 13 entirely overlaps the roughened area 12a. In this way, an area in which the entire semiconductor film 13 overlaps the roughened area 12a can be used as the initialization transistor T1 for a drive transistor.

The methods for manufacturing an active matrix substrate 10 according to the second embodiment and the third embodiment include a step of providing the threshold voltage compensation transistor T2 having the semiconductor film 13 that the gate electrode 15 and the roughened area 12a overlap. In the active matrix substrates 10 according to the second embodiment and the third embodiment, the gate electrode 15 and the roughened area 12a overlap each other in the semiconductor film 13 that forms the threshold voltage compensation transistor T2. In this way, an area in which the semiconductor film 13 overlaps the gate electrode 15 and the roughened area 12a can be used as the threshold voltage compensation transistor T2.

The methods for manufacturing an active matrix substrate 10 according to the second embodiment and the third embodiment include a step of providing the threshold voltage compensation transistor T2 having the semiconductor film 13 that entirely overlaps the roughened area 12a. In the active matrix substrates 10 according to the second and third embodiments, the entire semiconductor film 13 overlaps the roughened area 12a in the semiconductor film 13 that forms the threshold voltage compensation transistor T2. In this way, an area in which the entire semiconductor film 13 overlaps the roughened area 12a can be used as the threshold voltage compensation transistor T2.

OTHER EMBODIMENTS

In this embodiment, a used display element is not limited to the organic EL element as long as it is a display element of which luminance or transmittance is controlled using a current. Examples of a current-controlled display element include an organic light emitting diode (OLED), an inorganic light emitting diode (a quantum dot light emitting diode (QLED)), and the like.

The disclosure is not limited to the embodiment described above and can be implemented in various other forms. For this reason, such an embodiment is merely a simple example in every respect and should not be construed as limiting. The scope of the disclosure is defined by the claims and is not limited by the description presented here. Furthermore, all the modifications and changes belonging to a range equivalent to the scope of the claims are within the scope of the disclosure.

INDUSTRIAL APPLICABILITY

The disclosure relates to a method for manufacturing an active matrix substrate, and an active matrix substrate, and, particularly, can be applied for the purpose of increasing the S value of I-V characteristics (causing the slope of a characteristic waveform to be gentle), which is advantageous for gray scale control.

The invention claimed is:

1. An active matrix substrate in which an underlayer inorganic insulating film, a semiconductor film, a gate insulating film, and a gate electrode are formed in that order on a substrate,
wherein the underlayer inorganic insulating film has a roughened area and a flattened area,
the roughened area is formed to be a rough surface that is rougher than the flattened area, and
a surface of the semiconductor film overlapping the roughened area is roughened following the rough surface of the underlayer inorganic insulating film.

2. The active matrix substrate according to claim 1,
wherein the roughened area is formed to entirely overlap the semiconductor film that forms one or more transistors.

3. The active matrix substrate according to claim 2,
wherein an interlayer film and a source electrode are included in order above the gate insulating film and the gate electrode,
the roughened area is formed to overlap the semiconductor film that overlaps at least the gate electrode,
the semiconductor film is electrically connected to the source electrode via a contact hole formed in the gate insulating film and the interlayer film, and
at least the contact hole and the flattened area overlap each other.

4. The active matrix substrate according to claim 2, further comprising:
a pixel circuit including a drive transistor and a write transistor,
wherein the gate electrode and the roughened area overlap each other in the semiconductor film that forms the drive transistor in the pixel circuit, and
the gate electrode and the flattened area overlap each other in the semiconductor film that forms the write transistor.

5. The active matrix substrate according to claim 2,
wherein a write transistor and a light emission control transistor are formed of the semiconductor film, which is continuous, and
at least a part of the semiconductor film between the light emission control transistor and the write transistor overlaps the flattened area.

6. The active matrix substrate according to claim 5,
wherein the gate electrode and the flattened area overlap each other in the semiconductor film that forms the light emission control transistor.

7. The active matrix substrate according to claim 2,
wherein the gate electrode and the roughened area overlap each other in the semiconductor film that forms an initialization transistor for a drive transistor.

8. The active matrix substrate according to claim 7,
Wherein the semiconductor film entirely overlaps the roughened area in the semiconductor film that forms the initialization transistor for a drive transistor.

9. The active matrix substrate according to claim 2,
wherein the gate electrode and the roughened area overlap each other in the semiconductor film that forms a threshold voltage compensation transistor.

10. The active matrix substrate according to claim 9,
wherein the semiconductor film entirely overlaps the roughened area in the semiconductor film that forms the threshold voltage compensation transistor.

* * * * *